US012738716B2

(12) United States Patent
Wilson

(10) Patent No.: US 12,738,716 B2
(45) Date of Patent: Sep. 15, 2026

(54) UNIVERSAL LASER FOR POLYMERIC MATERIAL PROCESSING

(71) Applicant: Markem-Imaje Corporation, Keene, NH (US)

(72) Inventor: Stewart W. Wilson, Clearwater, FL (US)

(73) Assignee: Markem-Imaje Corporation, Keene, NH (US)

( * ) Notice: Subject to any disclaimer, the term of this patent is extended or adjusted under 35 U.S.C. 154(b) by 1091 days.

(21) Appl. No.: 17/870,752

(22) Filed: Jul. 21, 2022

(65) Prior Publication Data

US 2023/0025089 A1 Jan. 26, 2023

Related U.S. Application Data

(60) Provisional application No. 63/224,833, filed on Jul. 22, 2021.

(51) Int. Cl.
*H01S 5/40* (2006.01)
*B23K 26/064* (2014.01)
(Continued)

(52) U.S. Cl.
CPC .......... *H01S 5/4087* (2013.01); *B23K 26/064* (2015.10); *H01S 5/02212* (2013.01);
(Continued)

(58) Field of Classification Search
CPC ............... H01S 5/4087; H01S 5/02212; H01S 5/02251; H01S 5/02253; H01S 5/02255;
(Continued)

(56) References Cited

U.S. PATENT DOCUMENTS

2003/0086448 A1* 5/2003 Deacon .................. H01S 5/141 372/20
2006/0009342 A1* 1/2006 Sirota ................ C03C 10/0036 501/4

(Continued)

FOREIGN PATENT DOCUMENTS

EP 3636443 4/2020

OTHER PUBLICATIONS

Partial European Search Report in European Appln No. 22186593.4, dated Nov. 22, 2022, 13 pages.

(Continued)

*Primary Examiner* — Robert G Bachner
(74) *Attorney, Agent, or Firm* — Fish & Richardson P.C.

(57) ABSTRACT

Methods, systems, and apparatus, including medium-encoded computer program products, for a universal laser system including a laser operable to produce an infrared laser beam for a range of wavelengths, an optics assembly operable to focus and direct the laser beam, and electronics communicatively coupled with the laser and the optics assembly, the electronics being configured to control the laser and the optics assembly, where the laser is configured to produce the infrared laser beam at wavelengths in the range of wavelengths that overlap with absorption peaks due to higher-order, non-linear oscillations of molecular bonds of each polymeric material of at least ten different polymeric materials, thereby generating heat from absorption of photon energy from the infrared laser beam.

36 Claims, 10 Drawing Sheets

(51) Int. Cl.

| | |
|---|---|
| ***H01S 3/23*** | (2006.01) |
| ***H01S 5/02212*** | (2021.01) |
| ***H01S 5/02251*** | (2021.01) |
| ***H01S 5/02253*** | (2021.01) |
| ***H01S 5/02255*** | (2021.01) |
| ***H01S 5/068*** | (2006.01) |

(52) U.S. Cl.
CPC ...... *H01S 5/02251* (2021.01); *H01S 5/02253* (2021.01); *H01S 5/02255* (2021.01); *H01S 5/068* (2013.01); *H01S 5/4012* (2013.01); *H01S 3/2391* (2013.01); *H01S 5/4031* (2013.01); *H01S 2302/00* (2013.01)

(58) Field of Classification Search
CPC ...... H01S 5/068; H01S 5/4012; H01S 3/2391; H01S 5/4031; H01S 2302/00; B23K 26/064; B41M 5/26; B41M 5/24; B41M 5/267; B29C 64/268; B29C 64/393; B33Y 30/00; B33Y 50/02; B41J 2/4753
See application file for complete search history.

(56) References Cited

U.S. PATENT DOCUMENTS

| | | | | |
|---|---|---|---|---|
| 2008/0250954 | A1 | 10/2008 | Depta et al. | |
| 2010/0157419 | A1* | 6/2010 | Clowes | G02F 1/383 359/341.3 |
| 2018/0011267 | A1* | 1/2018 | Lau | G02B 6/4269 |
| 2018/0056590 | A1 | 3/2018 | Costabeber | |
| 2020/0030879 | A1 | 1/2020 | Liang et al. | |
| 2021/0156674 | A1* | 5/2021 | Furnas | G01L 1/241 |
| 2021/0234064 | A1* | 7/2021 | Piao | H10H 20/0137 |

OTHER PUBLICATIONS

Extended European Search Report in European Appln No. 22186593.4, dated Jan. 23, 2023, 11 pages.
Office Action in European Appln. No. 22186593.4, dated Nov. 2, 2023, 4 pages.
Berube et al., "Direct Inscription of on-surface waveguides in polymers using a mid-ir fiber laser," Optics Express, Oct. 14, 2019, 27(21): 31013-31022.
Chatani et al., "The power of light in polymer science: photochemical processes to manipulate polymer formation, structure, and properties," Polymer Chemistry, 2014, 32 pages.
Chow et al., "Selective Laser Processing Of Multi-Layer Material," Industrial Laser Solutions, Nov. 1, 2009, 6 pages.
Duval, "Mid-infrared lasers: Applications overview," Industrial Applications/Scientific Applications/Learning, Jul. 2, 2020, 4 pages.
Emslie, "Review Polymer Optical Fibre," Journal of Materials Science, 1988, 2281-2293.
Frayssinous et al., "Resonant polymer ablation using a compact 3.44 μm fiber laser," Center for Optics, Photonics and Lasers, Oct. 2017, 17 pages.
Johnson et al., "Effects of the absorption coefficient on resonant infrared laser ablation of poly(ethylene glycol), " Journal of Applied Physics, Jan. 2009, 6 pages.
Lloyd, "Near-IR Laser Ablation of Organic Polymeric Materials," Dissertation submitted in partial fulfillment of the requirements for the degree of Doctor of Philosophy at George Mason University, 2009, 158 pages.
Lloyd, "Near-IR Laser Ablation of Organic Polymeric Materials," Preview of Dissertation submitted in partial fulfillment of the requirements for the degree of Doctor of Philosophy at George Mason University, 2009, 24 pages.
Max Planck Society, "Light waves allow preferred bond breaking in symmetric molecules," Phys.org, May 9, 2014, 4 pages.
Naithani et al., "Mid-infrared resonant ablation of PMMA," Proceedings of LAMP2013—the 6th International Congress on Laser Advanced Materials Processing, 2013, 5 pages.
NDT, [online] "Polymer Structure," available on or before May 2, 2005, retrieved from URL <https://www.nde-ed.org/EducationResources/CommunityCollege/Materials/Structure/polymer.htm> on Jan. 22, 2021, 3 pages.
Pearson, "Cleanliness Evaluation of Rough Surfaces with Diffuse IR Reflectance," Aerospace Environmental Technology Conference, Aug. 10-11, 1994, 10 pages.
Ravi-Kumar et al., "Laser Ablation of Polymers: A Review," 47th SME North American Manufacturing Research Conference, 2019, 12 pages.
Schaubroeck et al., "Mid-Infrared Resonant Ablation of PMMA," Journal of Laser Micro/Nanoengineering, Jun. 2014, 7 pages.
Zewail, "Laser selective chemistry-is it possible?," Physics Today, Nov. 1980, 8 pages.

* cited by examiner

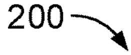
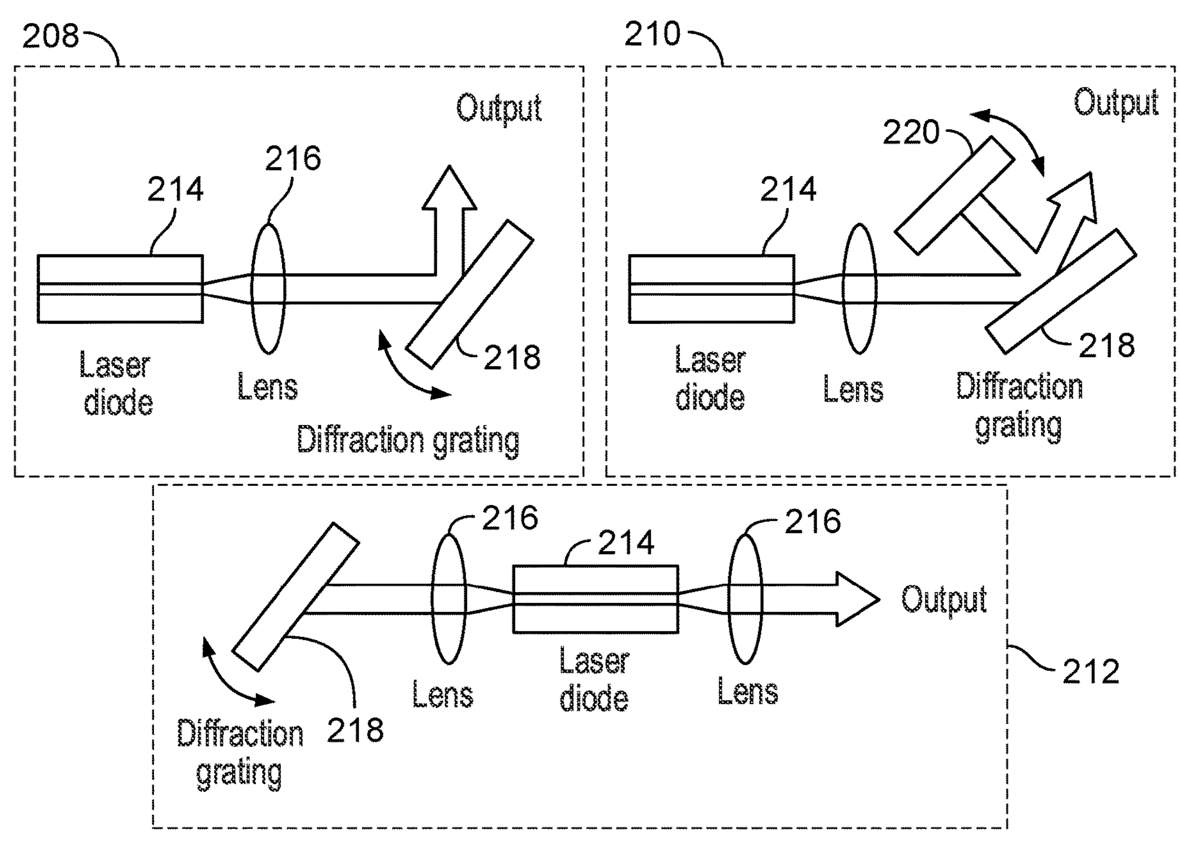
FIG. 2C

Receive, from a user, a set of user input parameters for a polymeric materials process for a product 302

Access, from a materials database, materials characteristics for a materials system of the product and, from a laser specifications database, laser specifications of a laser source 304

Determine, from the set of user input parameters, and based on the materials characteristics for a materials system of the product and the laser specifications of a laser source, a set of control parameters 306

Generate, from the control parameters, a set of operating instructions for controlling operation of a universal laser apparatus 308

Provide, to the universal laser apparatus, the set of operating instructions to perform the polymeric materials process 310

FIG. 3

UNIVERSAL LASER FOR POLYMERIC MATERIAL PROCESSING

CROSS-REFERENCE TO RELATED APPLICATION

This application claims the benefit of U.S. Provisional Application No. 63/224,833, filed on Jul. 22, 2021, the contents of which are incorporated by reference herein.

BACKGROUND

This specification relates to industrial printing systems, and in particular, systems and techniques relating to laser-based processing of polymeric materials for marking and coding, package separation and perforation, plastic material machining, and additive manufacturing of products in a manufacturing or distribution facility.

Various industrial printing technologies are known and enable the printing of important information (e.g., sell by dates) on packaging. Dot-matrix type laser marking devices have been used to print identification codes on commercial products. These codes are readily observable on common products such as soda cans, cosmetics, pet food containers, etc. Some government regulatory agencies, such as the Food and Drug Administration in the U.S., may require certain products to have such codes. These codes often include information that is unique to the time and place at which the product is manufactured. For instance, many codes communicate a batch number associated with a product. Many codes go further and indicate the actual time and date of manufacture. Because some codes relate to unique manufacturing parameters (e.g., time and date), some codes cannot be pre-printed on a label for a product. Hence, a code is often printed on the label after the product is manufactured.

Marking and coding can require that a discernable and indelible human or machine-readable mark be written on the desired target location of a particular substrate for various applications. Using lasers, this may require that the light interacts with the materials in such a way so as to achieve this outcome. For many polymeric materials, e.g. high density polyethylene (HDPE), this may not be possible using standard $CO_2$ lasers operating in the 9.2 to 10.6 um wavelength range, nor with standard fiber lasers operating in the approximately 1.06 to 1.08 μm range.

SUMMARY

This specification describes technologies relating to a universal laser system for polymeric material processing.

Polymeric materials including a C—H bond can absorb light emission in the 3.2 to 3.6 μm spectral region (i.e., a primary absorption band). The spectral peak of the primary absorption band is located at approximately 3.4 μm and has spectral width ranging between approximately tens to hundreds of nanometers. Energy transfer from optical power to heat for this primary absorption band occurs via the dipole oscillations due to the frequency (wavelength) overlap when a polymeric material including the primary absorption band. The polymeric material can be exposed to a laser emitting within the overlapping wavelength range with adequate optical energy. The transfer of optical power to heat in the polymeric material can be utilized to facilitate an interaction that can be employed in a variety of material processes utilizing a pyrolytic heating effect, for example, laser marking and coding, laser perforation and separation, laser machining and cutting, and potential 3D (three dimensional) laser additive manufacturing processes. Both fixed wavelength and variable wavelength laser sources can be used to produce an infrared laser beam. Variable wavelength systems can be utilized in a universal laser system to add tunability of the employed absorption as part of an additional process optimization or employed for process selection.

Wavelength tunability can be employed discretely or continuously. In some implementations, discrete wavelength tuning can be implemented by optically combining separate discrete lasers operating at different wavelengths, with wavelength spacing between the different wavelengths being determined by selection of the set of lasers for the design, for example, on the order of tenths of microns to microns. In some implementations, continuous tuning can be employed by utilizing a single laser and externally tuning the laser through a gain bandwidth of the laser, with wavelength spacing typically on the order of much less than 0.1 microns. Continuous tunability can be implemented, for example, using a single laser and rotating mirror, using a nonlinear gain element (nonlinear crystal), or the like. In some implementations, a combination of discrete lasers and continuously tunable lasers can be utilized to achieve wavelength tunability.

A secondary interaction region of interest is located between the wavelengths from 1.7 and 2.7 μm (i.e., a secondary absorption band). The interactions can occur due to higher-order, overtone non-linear oscillations of the molecular dipole bonds. The secondary interaction region can be utilized to provide significantly higher energy concentration via tighter focus and increased optical power in polymeric materials processing and may compensate for lower absorption of the secondary absorption band.

In some implementations, there can be two primary absorption bands, e.g., primary-A and primary-B absorption bands. The absorption coefficients for polymeric materials in the wavelength range of primary-A absorption band A is generally greater than or equal to that of primary-B absorption band B. The absorption coefficient for polymeric materials in the wavelength range of the secondary absorption band is less than those of the primary absorption bands by at least an order of magnitude.

In general, one innovative aspect of the subject matter described in this specification can be embodied in a system including a laser operable to produce an infrared laser beam for a range of wavelengths, an optics assembly operable to focus and direct the laser beam, and electronics communicatively coupled with the laser and the optics assembly, the electronics being configured to control the laser and the optics assembly, where the laser is configured to produce the infrared laser beam at wavelengths in the range of wavelengths that overlap with absorption peaks due to higher-order, non-linear oscillations of molecular bonds of each polymeric material of at least ten different polymeric materials, thereby generating heat from absorption of photon energy from the infrared laser beam.

Other embodiments of this aspect include corresponding systems, apparatus, and computer programs, configured to perform the actions of the methods, encoded on computer storage devices.

The foregoing and other implementations can each optionally include one or more of the features described herein, alone or in combination. In particular, one or more implementations include all the following features in combination. In some implementations, the laser is configured to produce the infrared laser beam in a wavelength range of 1.7 to 2.7 microns. The laser can be operable to produce a continuously tunable infrared laser beam for the range of wavelengths, produce multiple discretely tunable infrared laser beams at multiple different wavelengths for the range of wavelengths, or a combination thereof In some implementations, the laser is further configured to produce the infrared laser beam at another wavelength that overlaps a primary absorption peak due to C-H dipole interactions of each polymeric material of the at least ten different polymeric materials. The laser can be configured to produce the infrared laser beam in a wavelength range of 3.2 to 3.6 microns.

In some implementations, the laser can be configured to produce the infrared laser beam in a wavelength range of 6.5 to 7.5 microns.

In some implementations, the system further includes a second laser communicatively coupled with the electronics and configured to produce an infrared laser beam for another wavelength that overlaps a primary absorption peak due to C-H dipole interactions of each polymeric material of the at least ten different polymeric materials.

In some implementations, the laser is a semiconductor laser based on II-VI or III-V compound materials such as InP, InGaAs or GaSb.

In some implementations, the laser is a diode or fiber pumped solid-state laser.

In some implementations, the laser is a solid-state laser comprising a host crystal of ZnS/Se doped with $Cr^{2+}$or $Fe^{2+}$.

In some implementations, the at least ten different polymeric materials include plastic, foam and rubber materials. The at least ten different polymeric materials can include HDPE, LDPE, BOPP, PAI6, PAI6.6, PE, PET-G, PMMA, POM, PP, PVC, and PCV-pl.

One or more implementations can employ software or firmware to effect the operations described. Thus, as will be appreciated, a non-transitory, computer-readable medium can encode instructions configured to cause data processing apparatus to perform one or more methods, as detailed above and below. Moreover, the system can include the universal laser system.

Particular embodiments of the subject matter described in this specification can be implemented so as to realize one or more of the following advantages. Variable wavelength (i.e., discrete and/or continuously tunable wavelength) laser systems can provide tunability of the employed absorption as part of an additional optimization process or employed as a technique for process selectability.

A universal laser system including a tunable optical output and/or multiple wavelength optical output that includes both a primary absorption band and one or more secondary absorption bands of multiple polymeric materials can be utilized to customize a process for a particular polymeric material based on a desired end-result, e.g., to perform marking and coding, package separation and perforation, plastic material machining, and/or additive manufacturing of products including the particular polymeric material(s) being processed.

Utilizing an incident laser tuned to a secondary absorption band for a polymeric material can reduce an amount of absorption of the laser energy, which can result in a less pyrolytic reaction into the material in comparison to utilizing an incident laser tuned to a primary absorption band of the polymeric material. The secondary absorption band for many polymeric materials may correspond to a shorter wavelength (i.e., 1.7 to 2.7 μm) than a primary absorption band of the same materials (e.g., ~3.4 μm), such that utilizing laser systems tuned to the secondary absorption band wavelength can result in the ability to focus a smaller tighter beam (smaller spot size), thus providing a significantly higher concentration of light power, which may compensate for the lower absorption.

Laser systems associated with the 1.7-2.7 μm wavelength range may be more mature, available at higher output powers, have increased tunability over a wider range of wavelengths, and may be more cost-efficient than less mature mid-infrared range laser systems. Lasers associated with light signal emission in the secondary range can potentially be utilized in more compact, reliable configurations for seamless integration and increased reliability, e.g., mature, compact semiconductor lasers.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIG. 2C shows examples of configurations with diode lasers that allow wavelength tunability.

FIG. 3 shows an example of a process of the universal laser system.

Like reference numbers and designations in the various drawings indicate like elements.

DETAILED DESCRIPTION

Figure 1:
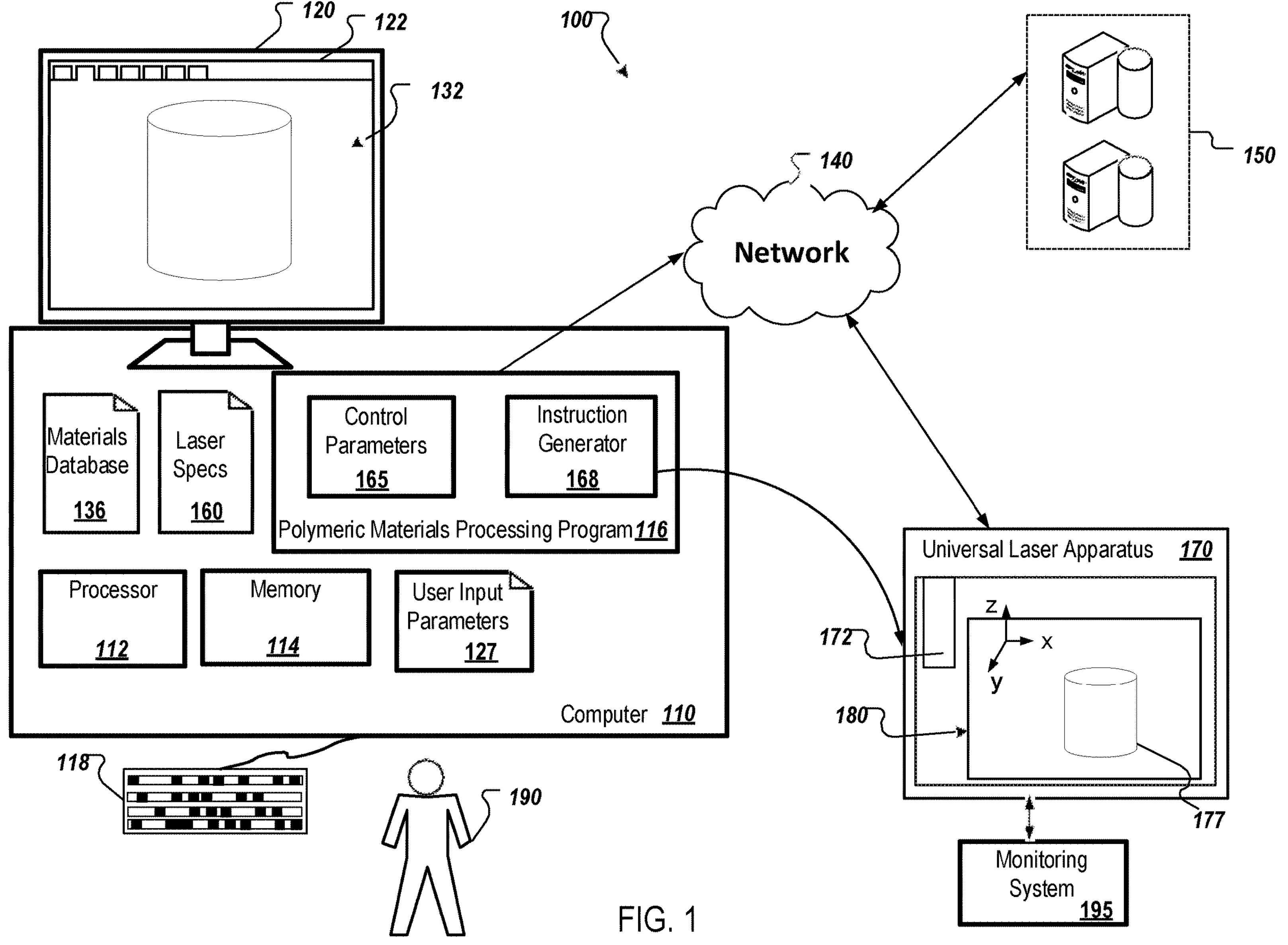
FIG. 1 shows an example of a universal laser system usable to process polymeric materials.

Optical absorption in the spectral region of 0.35 to 12 μm can occur for a large set of polymeric materials, and many polymeric materials show a common absorption range between 1.7 to 2.7 μm at absorption levels usable for polymeric material processes that take advantage of the pyrolytic nature of the interaction. The common absorption range between 1.7 and 2.7 μm for many polymeric materials is due to the overlap of the emission wavelength with the secondary oscillations of the C—H dipole molecule of these polymeric materials, and can be employed in a variety of material process applications such as, laser marking and coding, laser perforation and separation, laser machining and cutting, and potential 3D laser additive processes. In other words, a primary mechanism for energy transfer from optical power to heat can occur via the dipole oscillations due to the frequency (wavelength) overlap when a polymeric material is exposed to light emission at these same frequencies. These interactions occur due to higher overtone oscillations of the molecular dipole bonds.

A laser emitting in this region having adequate optical energy can facilitate an interaction that can be employed in a variety of material processes that utilize the pyrolytic heating effect. Fixed wavelength and variable wavelength (i.e., tunable wavelength) laser system can be utilized.

As used herein, the primary absorption band refers to the spectral absorption region for polymeric materials between the 3.2 to 3.6 μm range due to C—H bonds in the polymeric materials. A secondary absorption band refers to the spectral absorption region for polymeric materials between 1.7 to 2.7 μm range due to higher overtone oscillations of molecular dipole bonds in the polymeric materials. Polymeric materials may have spectral absorption regions in the primary absorption band or in the primary and secondary absorption bands.

The primary absorption band can also refer to the spectral absorption region for polymeric materials between the 6.5 to 7.5 μm range, due to C—H bonds in the polymeric materials. Some polymeric materials exhibit the primary A (3.2 to 3.6 μm), primary B (6.5 to 7.5 μm), or both absorption bands.

Polymeric materials play an integral role in many applications and uses. They are sometimes referred to as polymers (plastics, foam and rubber). A polymer is a large molecule, or macromolecule, composed of millions of repeated linked units, each a relatively light and simple molecule, which together form a chain. These chains are formed from covalent union of various monomer units. Polymeric materials can be synthetic or natural.

Some examples of plastics formed of polymeric material(s) include, but not limited to, polyethylene terephthalate (PET), high and low density polyethylene (HDPE, LDPE), polyvinyl chloride (PVC), polypropylene (PP), polystyrene (PS), polycarbonate (PC), nylon (PAI, PAI6, PAI6.6 . . . etc.), polyethylene (PE), polyimide (PI), polyamide (PA), polyimide-amide (PAI), Polyoxymethylene (POM), Polymethyl methacrylate (PMMA). Common in all polymeric materials is the C—H dipole bond.

A non-limiting list of polymeric materials that include primary and secondary absorption bands includes: HDPE, LDPE, biaxially-oriented Polypropylene (BOPP), PAI6, PAI6.6, PC, PE, PET, PET-G, PI, PP, PMMA, POM, PS, PVC, and plasticized polyvinyl chloride (PVC-p1).

FIG. 1 shows an example of a universal laser system 100 usable to process polymeric materials. Computer 110 includes a processor 112 and a memory 114, and the computer 110 can be connected to a network 140, which can be a private network, a public network, a virtual private network, etc. The processor 112 can be one or more hardware processors, which can each include multiple processor cores. The memory 114 can include both volatile and non-volatile memory, such as Random Access Memory (RAM) and Flash RAM. The computer 110 can include various types of computer storage media and devices, which can include the memory 114, to store instructions of programs that run on the processor 112.

Such programs can include a polymeric materials processing program 116 for processing polymeric materials using a universal laser apparatus 170. A user 190 can interact with the program(s) 116 to create operating instructions for performing one or more processes on a polymeric material-based product, e.g., marking/coding, perforation, or the like, by the universal laser apparatus 170. The program(s) 116 can run locally on computer 110, remotely on a computer of one or more remote computer systems 150, (e.g., one or more third party providers' one or more server systems accessible by the computer 110 via the network 140) or both, locally and remotely. The program(s) 116 can be software and/or firmware. The computer 110 can include a controller device with embedded code configured to cause the operations described, and the computer 110 can be integrated (partially or fully) into the universal laser apparatus 170.

In some implementations, user 190 can provide user input parameters 127, for example, a type of polymeric materials processing (e.g., laser marking/coding, perforation/separation, etc.), a type of polymeric material(s) being processed (e.g., HDPE, PE, PVC, etc.) and other information related to the desired outcome of the materials process (e.g., a pattern to be marked/coded, a perforation pattern, dimensions of a part to be manufactured using additive manufacturing, etc.). User input parameters 127 can be utilized by program(s) 116 to generate a set of control parameters 165 for the universal laser apparatus 170 to perform one or more operations, e.g., laser marking/coding, perforation/separation, etc.

In some implementations, program(s) 116 includes one or more three-dimensional (3D) models and manufacturing control programs such as Computer Aided Design (CAD) and/or Computer Aided Manufacturing (CAM) program(s) 116, also referred to as Computer Aided Engineering (CAE) programs, etc. User 190 may interact with such programs to generate a model of a part to be manufactured by additive manufacturing (AM) processes, e.g., selective laser sintering (SLS).

Program(s) 116 can receive data from a materials database 136 including characteristics of multiple polymeric materials, additives/colors/dyes/dopings, and the like. Characteristics can include, for example, absorption coefficients of each material, chemical structures, thicknesses of common products, bond disassociation energies, primary absorption band wavelength range, secondary absorption band wavelength range, and the like. Additionally, thermal-mechanical material properties can be stored, e.g. thermal conductivity, thermal diffusivity, specific thermal capacitance, glass transition temperature, melting temperature, crystallization temperature, heat of fusion, heat of vaporization, vaporization temperature, and degradation temperature.

Program(s) 116 can receive data from a laser specifications database 160 including operating characteristics of the one or more laser sources 172 and/or laser modules available for use by the universal laser apparatus 170. Laser specifications can include one or more of operating wavelength(s), tunability (for tunable wavelength laser sources), pulsewidth (for pulsed laser sources), output power, dwell time, beam overlap %, operating voltage and current, focal distance, M-squared values (beam propagation ratio or beam quality factor), pre-lensed beam diameter, mode of operation (continuous-wave (CW), pulsed) and the like.

Program(s) 116 can select, based on one or more of the user input parameters 127, materials database 136, laser specifications database 160, and/or control parameters 165 for controlling operation of the laser source(s) 172 to perform the desired materials process on a product 177 by the universal laser apparatus 170. Control parameters 165 can be selected based on 1) irradiance, 2) the interaction time, and/or 3) the absorption into the material.

These control parameters can be fixed, or adjusted in their application. Further discussion of the control parameters are found below.

Based on the control parameters 165, the program(s) 116 can generate a set of instructions by an instruction generator 168 for controlling the operations of the universal laser apparatus 170, e.g., to control operation of laser source(s) 172, a motion stage 180 configured to retain a product 177 within a working environment of the universal laser apparatus 170 and/or a motion stage 180 (e.g., a conveyor)

configured to move a product 177 through a working environment of the universal laser apparatus 170 (e.g., in a product manufacturing and/or distribution facility).

Universal laser apparatus 170 can include a monitoring system 195 to monitor and optionally provide a feedback loop to processes performed by the universal laser apparatus 170, e.g., to adjust operating instructions for laser source(s) in real-time. Monitoring system 195 can log data associated with processes performed by the universal laser apparatus 170 on product 177.

A user 190 may interact (e.g., using a keyboard 118 or other computer peripheral) with the universal laser system 100 via a user interface 132 of an application 122 displayed on a display device 120. The user 190 may provide user input parameters 127 via the user interface 132 to define one or more polymeric materials processes to perform on a product 177 in the universal laser apparatus 170.

Universal laser system 100 includes one or more infrared laser sources 172 configured to produce infrared laser beams. Various laser sources can be utilized to perform the processes described herein, provided they have the following properties: i) a wavelength emission that resides in the target absorption range (i.e., primary and/or secondary range), ii) adequate optical power to effect a desired response in the target material (i.e., can produce a discernable mark that can be seen by the naked unaided eye, e.g., ones to hundreds of Watts of average output power), and iii) appropriate size, weight and power (SWAP) for the given application.

In some implementations, laser sources 172 can be selected based on a tunability of output wavelength of the laser source 172 over a range of wavelengths, where each of the range of output wavelengths is output at a threshold amount of output power (e.g., sufficient to produce a discernable mark in multiple polymeric materials).

In some implementations, universal laser system 100 can include one or more laser sources 172 configured to output wavelengths that include the primary absorption band of one or more polymeric materials, include the secondary absorption band of one or more polymeric materials, or a combination thereof, and at output powers that are sufficient to perform the processes described herein.

In some implementations, the laser sources 172 for the primary absorption bands output wavelengths in the primary-A absorption band, primary-B absorption band, or both.

Universal laser system 100 can include lasers sources 172 including, but not limited to, the following example laser sources. In some implementations, laser sources include solid-state crystal, glass, and/or fiber lasers. For example, transition metal doped crystal using Cr2+:ZeSe/S crystal (i.e., with an output wavelength ranging between 1.8 to 3.4 μm), Ho:YAG, diode pumped solid-state lasers (DPSSL), TM3+doped Fiber lasers, transition metal doped fibers using Cr2+:ZeSe/S crystal (i.e., with an output wavelength ranging between 1.8 to 3.4 μm). An advantage of utilizing transition metal-based laser sources is that they can provide an ultra-broad spectral range that enables multiple wavelength options for fixed and tunable laser implementations, and they offer a variety of operational modalities (continuous-wave and pulsed).

In some implementations, laser sources 172 include semiconductor lasers based on II-VI and/or III-V compounds and antimonides, e.g., semiconductor lasers based on II-VI, III-V compounds and antimonide-based III-V lasers. For example, InGaAs laser operating between 1.6 to 2.1 μm, or GaSb laser operating between 2.0 to 3.0 μm. Semiconductor lasers can have a large spectral gain bandwidth which makes possible the selection of a specific monochromatic operating wavelength within the respective associated ranges of the laser sources. Semiconductor lasers can generate as much as between 1 to 20 W of optical power from a single-emitter, and more than 100 W in a multi-emitter bar configuration.

Semiconductor lasers may be packaged into a smaller compact design. Semiconductor lasers can result in energy efficient design and can have wall plug (electro-optical conversion) efficiencies of approximately 40-55% and 30-45% for InP and GaSb base materials, respectively.

Additionally, the size of semiconductor lasers can allow implementation of combining more than one wavelength in the primary-A, primary-B, and secondary absorption band wavelength ranges. Further, certain semiconductors, such as quantum cascade lasers, can emit light in the mid-infrared, making them useful when targeting the absorption band ranges of polymeric materials.

Figure 2A:
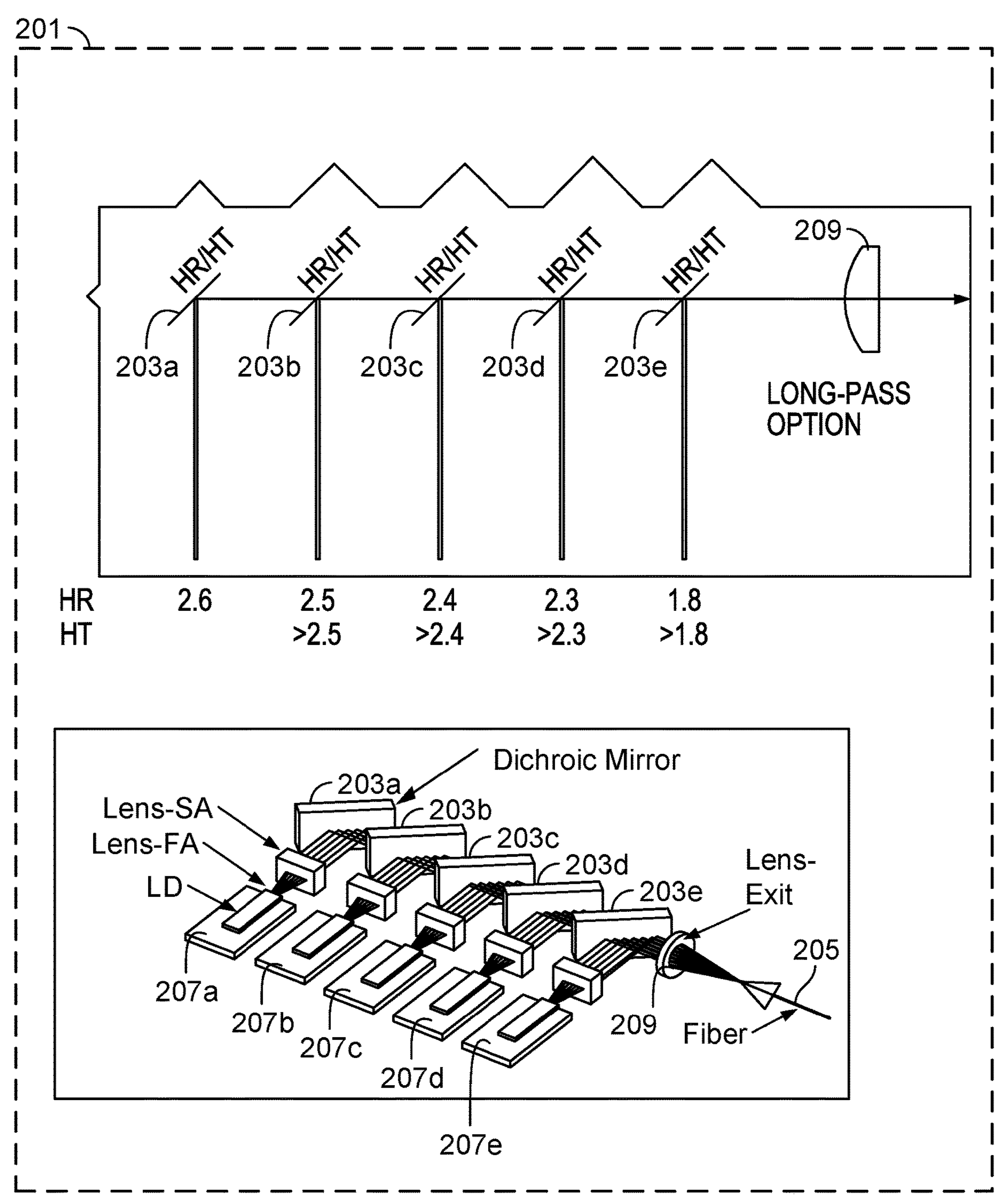
FIG. 2A shows an example of a diode laser with multiple wavelengths integrated together.
Figure 2B:
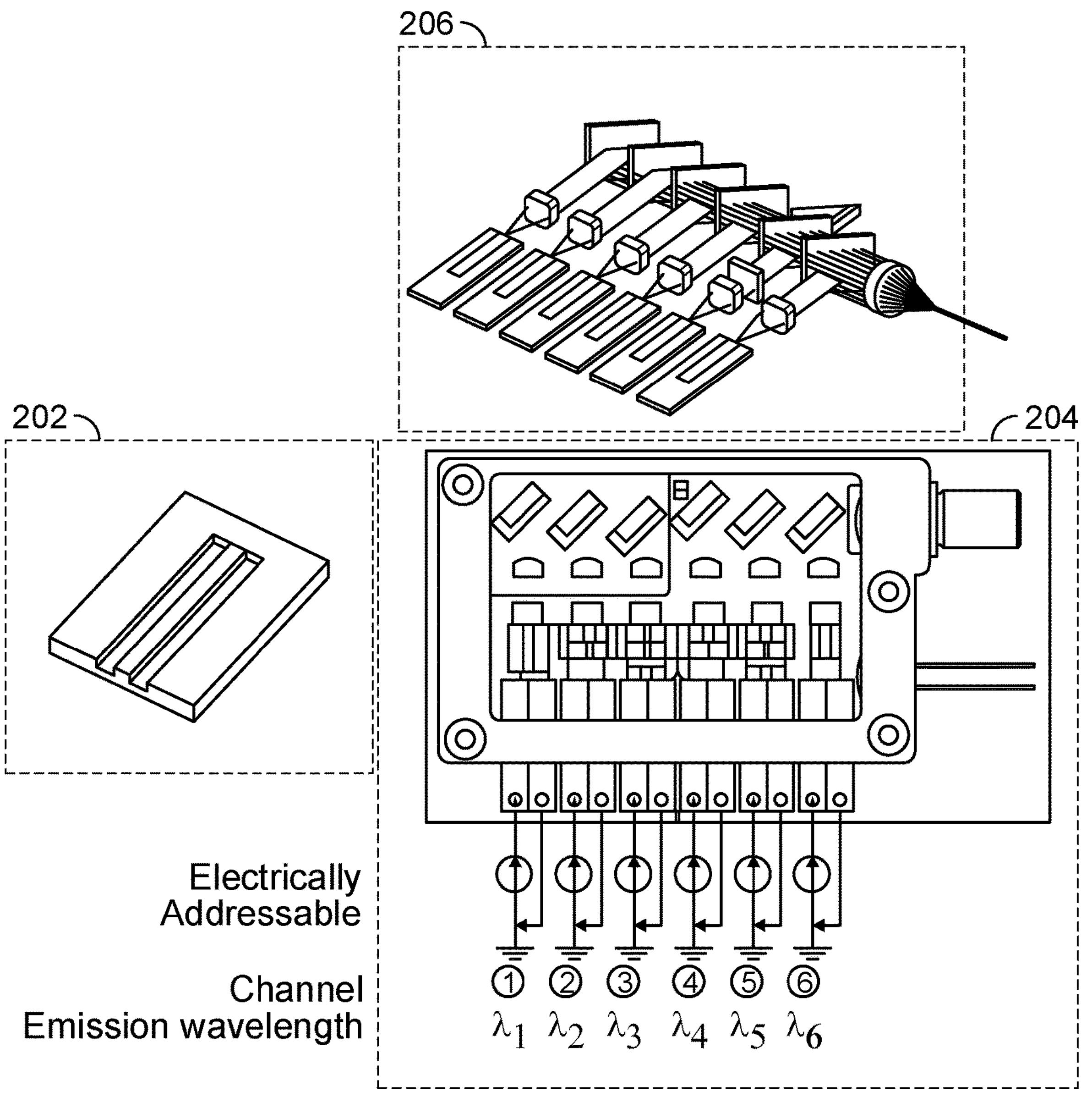
FIG. 2B shows an example of a laser system with electrically connected diode lasers.
Figure 2D:
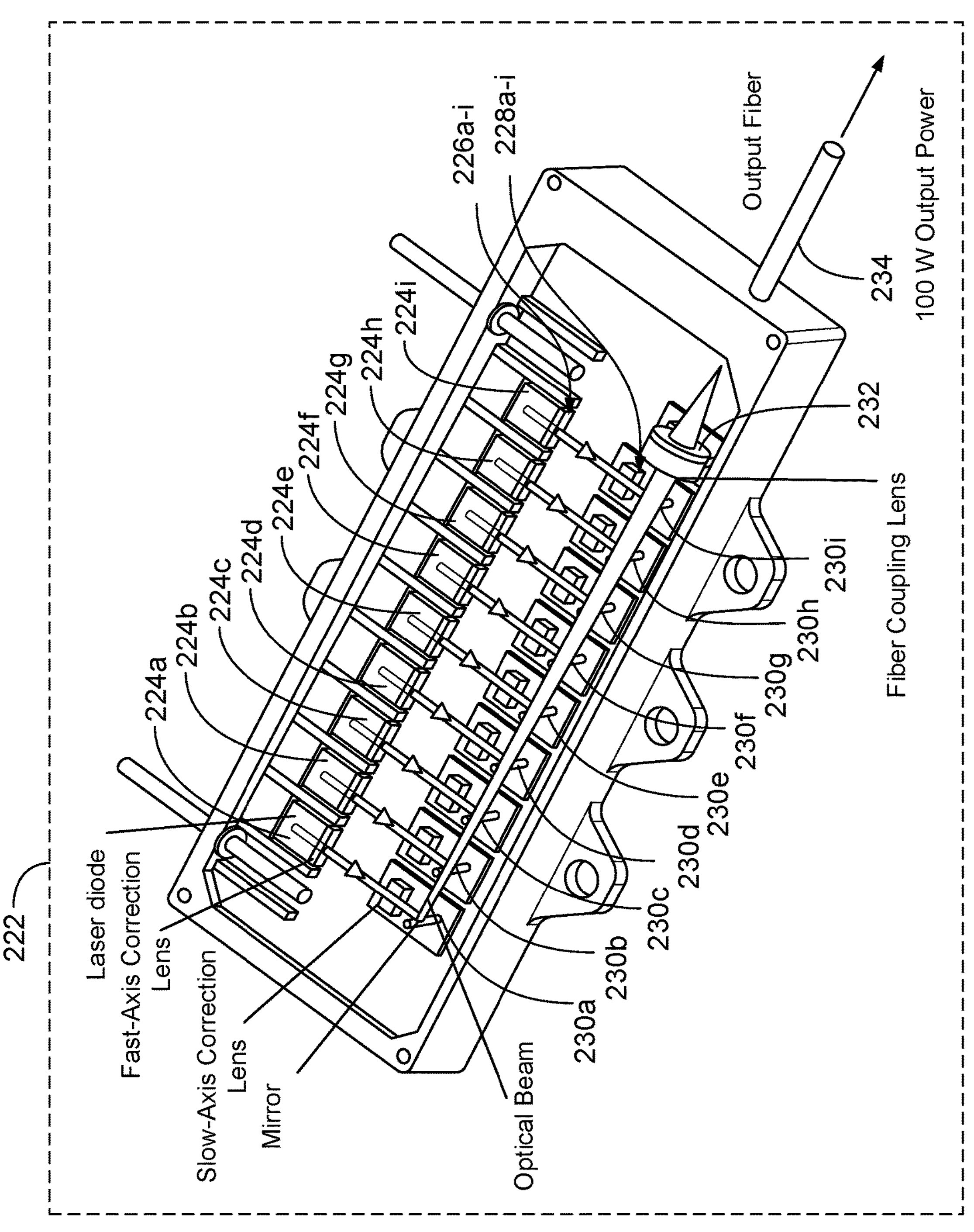
FIG. 2D shows an example of a configuration that couples an optical beam to an output optical fiber.
Figure 2E:
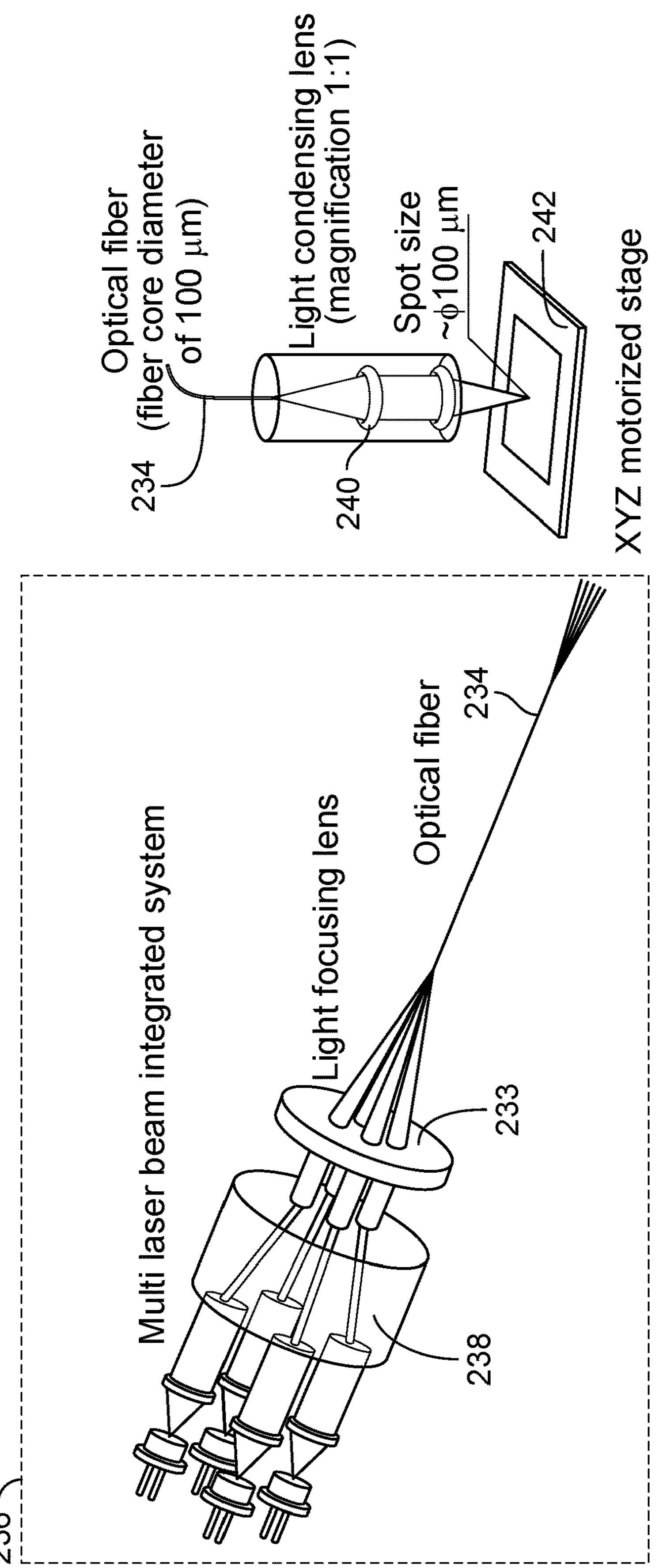
FIG. 2E shows an example coupling device.
Figure 2F:
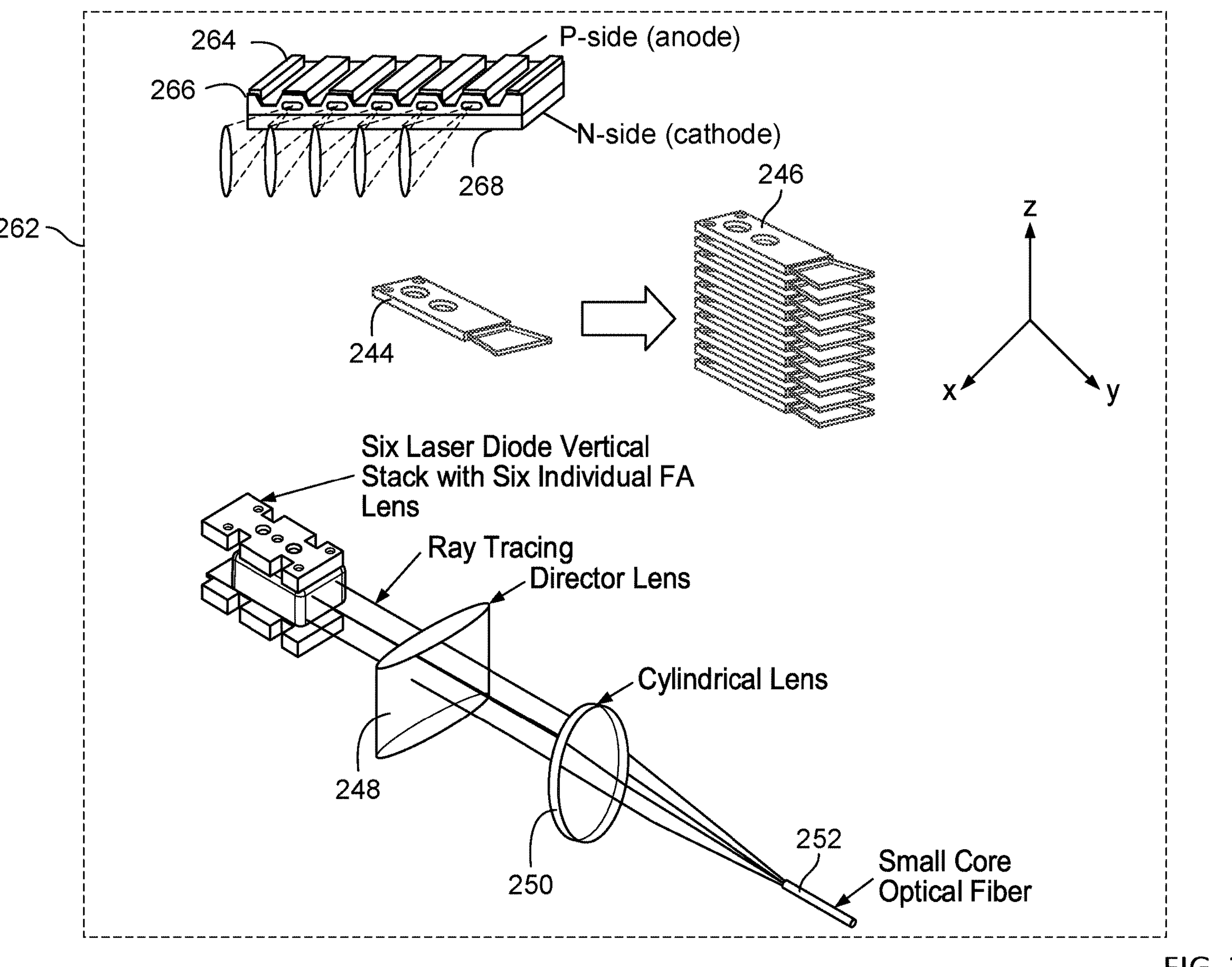
FIG. 2F shows an example stack of diode laser beams being converged in order to couple into an optical fiber.
Figure 2G:
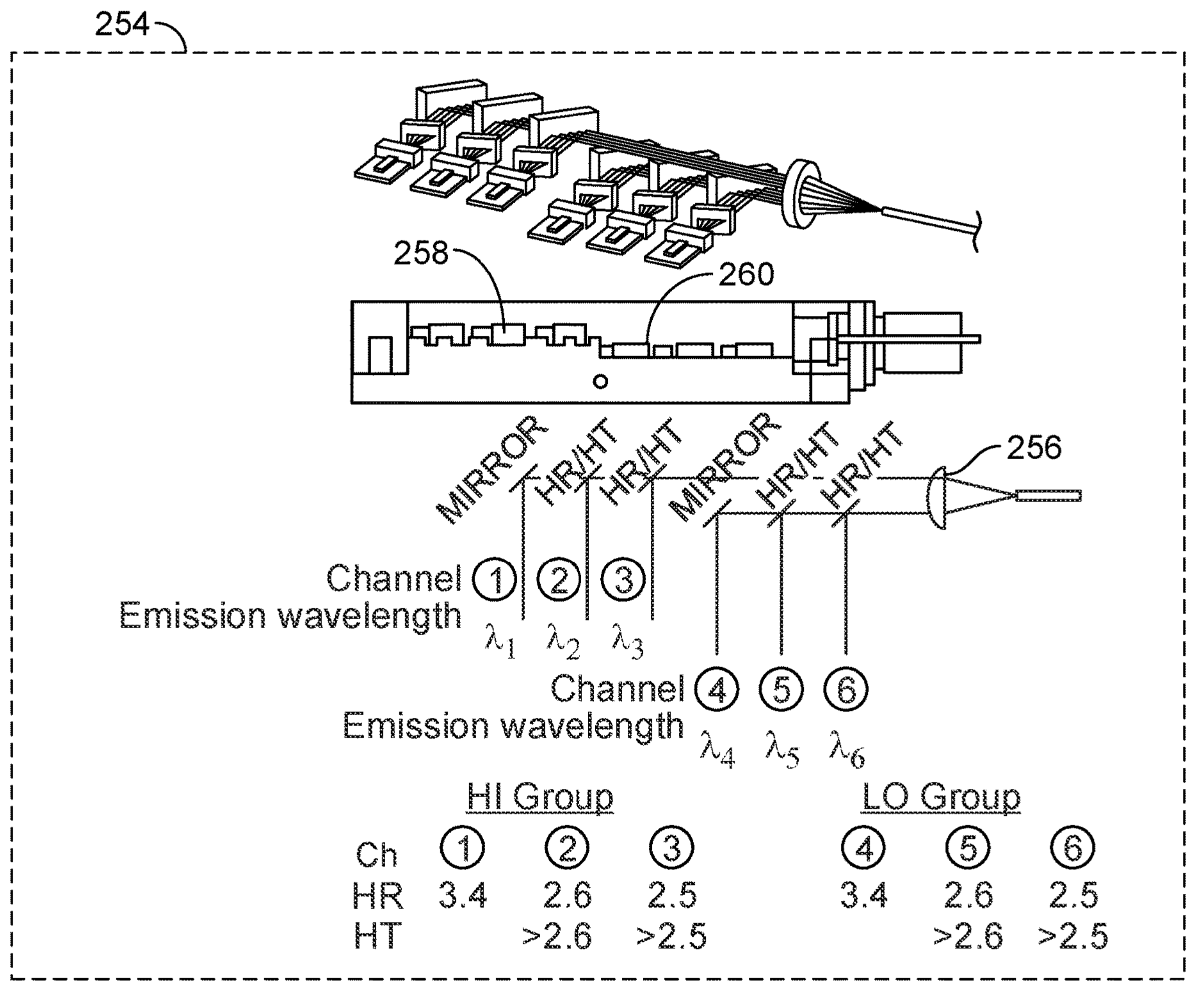
FIG. 2G shows an example configuration of laser sources arranged into two groups with different heights within a diode laser.

Described briefly here and in further detail below, FIGS. 2A-2G show examples of laser sources that could be suitable for laser sources 172 of FIG. 1. FIGS. 2A, 2B, 2G show examples of laser sources for the universal laser system that employ discrete wavelength tunability by way of wavelength beam combining. Lasers emitting at the same or different wavelengths can be integrated into a single module, and electronically activated (individually addressable) thus selecting which lasing wavelength to operate, both independently and/or simultaneously. FIG. 2C shows examples of laser sources for the universal laser system that employ continuous wavelength tunability, by way of an external cavity configuration. The selection of the emission wavelength is selected by an rotating external mirror to select a desired emission wavelength. FIGS. 2D-2F show examples of laser sources for the universal laser system that employ optical beam combining to enable higher optical powers. FIGS. 2D and 2E show examples of single emitter laser sources for the universal laser system that employ optical beam combining into an optical fiber. FIG. 2F shows examples of multiple emitter laser sources for the universal laser system that employ optical beam combining into an optical fiber.

In some implementations, universal laser system 100 can include multiple laser sources where each of the multiple laser sources can emit a respective wavelength within one or both absorption bands of a polymeric material (e.g., emit wavelengths in each of the primary and secondary absorption bands simultaneously or consecutively). Doing so may help to optimize the process between absorption, and energy concentration (i.e., irradiance) of the output by the laser. In some implementations, two or more lasers may be integrated together within a same laser module and an optical beam can be generated combining more than one wavelength and optical energy.

In some implementations, employing multiple wavelengths in different ranges, e.g., 3.4 μm in the primary-A absorption band range and 2.3 μm in the secondary absorption band range, 7.1 μm in the primary-B absorption band range and 2.5 μm in the secondary absorption band range, 3.2 μm in the primary-A absorption band range and 6.9 μm in the primary-B absorption band range, or 3.5 μm in the primary-A absorption band range and 7.4 μm in the primary-B absorption band range and 2.6 μm in the secondary absorption band range, can enable multiple types of absorption coupling into a target polymeric material and hence a more efficient energy transfer from photon energy to heat. Employing these multiple wavelengths in different ranges can reduce the amount of optical power used in causing the physical or chemical reaction caused by universal laser system 100.

Universal laser system 100 can include one or more optical assemblies (in addition to internal optics assemblies for the one or more laser sources) configured to direct an output of the one or more laser sources towards the polymeric material being processed. Optics assemblies can include, but are not limited to, focusing/concentrator lenses, a beam steering apparatus, filters, shutter assemblies, and the like. In some examples, universal laser system 100 can include a beam steering apparatus for directing an output beam of a laser source to produce a marking of a specified shape on the polymeric material being processed.

In some implementations, universal laser system 100 includes a single laser source configured to output a laser signal at a range of wavelengths and/or multiple output wavelengths including a wavelength within a primary absorption band and a wavelength within a secondary absorption band of one or more polymeric materials.

In some implementations, universal laser system 100 includes multiple laser sources, e.g., multiple fixed wavelength laser sources or two or more tunable laser sources, in a laser module that are spectrally combined, e.g., using fiber-based and/or lens-based assemblies. The multiple laser sources can be selected to increase operating wavelengths of the universal laser system.

In some implementations, two or more fixed wavelength laser diodes can be integrated together into a single laser package and configured to operate simultaneously or separately, e.g., as depicted in configuration 201 of FIG. 2A. The respective beams of light can be optically combined with, for example, a dichroic mirror 203, allowing one wavelength to transmit while reflecting other wavelengths, to enable a single output port, such as an optical fiber 205 or lens.

For example, five laser diodes 207*a-e* emitting different wavelengths can be organized in order of descending wavelength, e.g., the laser diode emitting the lowest wavelength is closest to the lens-exit 209. Each laser diode can face a corresponding dichroic mirror 203*a-e* that is either highly reflective (HR) or antireflective (AR) for a predetermined wavelength range. For example, the dichroic mirrors 203*e* in front of last laser diode 207*e*, e.g., to the farthest right, can be highly reflective of the wavelength emitted by the last laser diode, e.g., 1.8 μm, and AR for all wavelengths greater than the wavelength emitted by the last laser diode, e.g., greater than 1.8 μm. The dichroic mirror 203*d* in front of the penultimate laser diode can be HR for the wavelength emitted by the penultimate laser diode 207*d,* e.g., 2.3 μm, and AR for wavelengths below the wavelength emitted by the penultimate laser diode 207*d,* e. g, less than 2.3 μm. Laser diode 207*c* can face a dichroic mirror that is HR for 2.4 μm and AR for wavelengths greater than 2.4 μm. Laser diode 207*b* can face a dichroic mirror that is HR for 2.5 μm and AR for wavelengths greater than 2.5 μm. Laser diode 207*a* can face a dichroic mirror that is HR for 2.6 μm and AR for no wavelengths. Due to the dichroic mirror 203*e* for the last laser diode 207*e* being AR for wavelengths greater than 1.8 μm and being located in the path of the laser beams with greater wavelengths greater than that of laser diode 207*e,* this arrangement allows for all the reflected laser beams with different wavelengths to eventually reach the lens-exit 209, e.g., the "long-pass option", as in wavelengths arranged in order of length can pass through successive dichroic mirrors. Optionally there a fast-axis and slow-axis lens can be between each laser diode and its corresponding dichroic mirror, which can help collimate each laser beam.

The laser sources can be electrically connected in various ways to achieve different behavior. If connected electrically in series, the multiple laser sources can be configured to operate at a same time when electrically activated. If configured in parallel, each of the multiple laser sources can be configured to operate in any suitable number of combinations. Multiple lasers of a same wavelength can be included in the system 100 to increase the output of optical power afforded by the laser package. The activation of the laser sources can be computer controlled and would enable "on-the-fly" laser operation. In some cases, a first laser is selected to have an output wavelength corresponding to a secondary absorption band, for example to 2.4 +/−0.1 μm and a second laser is selected to have an output wavelength corresponding to a primary absorption band, e.g., at 3.4 μm.

In some implementations, a third laser is selected to have an output wavelength corresponding to a different primary absorption band, e.g., primary-B with at 7 μm.

In some implementations, a laser module can include multiple fixed wavelength laser diodes, e.g., six fixed wavelength laser diodes, that can emit at any suitable number of combinations of the different wavelengths, for example, a corresponding wavelength for each of the number of fixed wavelength laser diode (e.g., at six different wavelengths), or more/fewer different wavelengths than a number of fixed wavelength laser diodes. The laser module can be configured to allow selectivity of which laser of the multiple lasers is electrically activated and can be controlled by software via electronic control.

FIG. 2B includes a diode laser 202, a printed circuit board 204, and a laser system 206. Electricity is the power source for diode lasers. Consequently, diode lasers 202 can be connected in electrical circuits. Printed circuit board 204 can include multiple diode lasers.

Diode lasers can be connected in series, in parallel, or both on a printed circuit board 204. The electrical connections between the diode lasers can make them individually controllable.

For example, the laser system 206 includes six diode lasers 202. The printed circuit board 204 allows each diode laser 202 to be individually controlled, e.g., electrically addressable. The individually controlled diode lasers in laser system 206 can be configured each emit laser beams with descending channel emission wavelength, with the diode laser closest to the lens-exit emitting radiation with the shortest wavelength, similarly to how the system of FIG. 2A is arranged.

FIG. 2C shows example universal laser systems 200 that employ continuous wavelength tunability, by way of external cavity configuration. The selection of the emission wavelength is selected by rotating an external mirror to select the desired emission wavelength. Configuration 208 includes a laser diode 214, a lens 216, and a diffraction grating 218. The laser diode 214 can have a highly reflective (HR), e.g., between ~95 and 99% reflectivity, coating on one facet, e.g., the left side, and an antireflective coating (AR) that is highly transmissive e.g., less than ~1% reflectivity, coating on the other facet, e.g., the right side. The choice of coating types on each facet of the laser diode can determine through which side the laser beam exits. The laser beam can pass through a lens 216 before encountering a diffraction grating 218, this optical path defining the cavity for configuration 208. The optical power of the lens 216 can determine the beam width of the laser beam when it hits the diffraction grating 218. The choice of a suitable optical power of the lens 216 can depend on the arrangement of individual diode lasers and their wavelengths inside laser diode 214.

The orientation of the diffraction grating 218 can determine what wavelengths in the laser beam experience the greatest reflection in the direction of the output, e.g., allow wavelength tunability. For example, diffraction grating 218 can be a blazed transmission grating which reflects the zeroth diffraction order, where the wavelength of the laser beam determines the angle of reflection. In some implementations, adding a mirror 220 external to the AR side of the diode laser, as depicted in configuration 210, can help control the direction of the output laser beam. For example, the laser diode 214 in configuration 210 can have an HR coating (reflectivity between 95-99%) further from the mirror 220 and an AR coating (reflectivity less than 1%) closer to the mirror 220. For example, in configuration 208 the orientation of the diffraction grating 218 determines both the wavelength of the maximally reflected laser beam and the orientation of the output laser beam. However, with the addition of the mirror 220, the diffraction grating 218 can be oriented to just determine the wavelength of the maximally reflected laser beam, while the orientation of the mirror 220 can determine the final direction of the output laser beam. The addition of the mirror 220 can also extend the cavity of configuration 210. In some implementations, the mirror 220 is a motorized mirror, e.g., the mirror 220 can be controlled electrically by a motor, and the motor is used to rotate the mirror to select the desired wavelength.

In some implementations, other configurations are possible. For example, configuration 212 has a laser diode 214, which can have different coatings on each side with different levels of antireflection, e.g., an ARR coating the right side and an ARL coating on the left side. The ARL coating can have a very low reflectivity, e.g., less than 1%, and the $AR_R$ coating, which is located further from an external diffraction grating 218, can have a reflectivity between 1-10%. When exiting the laser diode 214 from the facet with ARL coating, the laser beam can pass through a lens 216 before encountering a rotatable diffraction grating 218. The orientation of the diffraction grating 218 can determine the wavelength of the laser beam that is redirected back towards the laser diode 214 and enters through the $AR_L$ coating. For this configuration, the ARR coating for the right side, e.g., output side, is coated to produce a reflectivity as low as between 1-10% to allow the laser beam to exit before encountering a lens 216 that directs the laser beam at output. Configuration 212 is another example of an arrangement to control wavelength tunability with the laser diode 214, lenses 216, and a diffraction grating 218.

Different configurations lend themselves to different methods of tuning. For example, all three configurations 208, 210, and 212 allow fine-tuning by changing the angle of a diffraction grating 218, a mirror 220, or both. The internal structure of the laser diode 214 can allow for discrete tuning by having multiple laser diodes arranged along the optical path within the diode.

In some implementations, a laser module including multiple tunable laser diodes, e.g., two or more tunable laser diodes, can be configured into a tunable wavelength configuration (e.g., continuously tunable over a range of wavelengths), where the multiple outputs of the respective laser diodes can be optically combined and integrated together into a single laser package where each would cover the primary and secondary absorption band ranges. In one example, as depicted in FIG. 2C, a continuously tunable laser module can include an external mirror and a laser source, for example a diode laser having one facet (rear) with a highly reflecting (HR) coating, and a second facet (front) with an antireflective (AR) coating, e.g., ~21 1% reflectivity, where the mirror is placed external to the front (AR side) of diode laser such to extend the laser cavity and enable wavelength tunability by way of rotation of mirror, the mirror can be controlled electrically by a motor, and the motor is used to rotate the mirror to select the desired emitting wavelength. In another example, a possible configuration includes a wavelength tuning mirror placed to the rear facet of the laser source, where the rear facet has an AR coating as well.

The broad spectral gain-bandwidth of semiconductor lasers can allow implementation of a tunable laser via an external cavity configuration. For example, an external cavity configuration can be employed by including an external mirror, a grating, or both, together with a low AR (antireflective) coating on one of the two laser facets. If one were to mount the mirror on to a motorized mechanism, such as, but not limited to, a galvanometer, or a microelectromechanical system (MEMS), it would be possible to implement an active user controlled wavelength tunability and selectivity feature.

FIGS. 2D-2F show examples of laser sources for the universal laser system that employ optical beam combining to enable higher optical powers. FIGS. 2D and 2E show examples of single emitter laser sources for the universal laser system that employ optical beam combining for output into an optical fiber. In some implementations, the configuration 222, as depicted in FIG. 2D, can include a fast-axis correction lens 226*a-i*, a slow-axis correction lens 228*a-i*, and a mirror 230*a-i* for every laser diode 224*a-i*. Each beam leaving a laser diode 224*a-i* reflects off of a corresponding mirror 230*a-i*, which can have a gold or HR coating, and propagates toward a fiber coupling lens 232. The floor of the casing holding configuration 222 can be angled, resulting in each beam of laser diodes 224*a-i* having a different height, e. g., the laser beams are optically stacked. Consequently, the intensity of the laser beam can grow as it approaches the fiber coupling lens 232. In some implementations, configuration 222 can be appropriate for high power applications for single-emitter lasers with wavelengths within the secondary absorption range, e.g., 2.4 to 2.8 μm.

In some implementations, optical beam combining can be implemented to increase an optical power output provided by a laser module. Depending on a desired need, a laser module can include multiple laser sources that are electrically configured in series or parallel. The example in FIG. 2D shows a configuration 222 connected in series. For example, multiple laser sources can be connected in series for simultaneous operation and connected in parallel for independent operation. Where connected in series, the laser module can be used to increase optical power. When connected in parallel, the laser module can be used to increase emission wavelength selectivity, provide more optical power, or a combination of the two. In some implementations, a laser module can include multiple laser sources that can be optionally connected in either series or parallel (i.e., include both connections and operate in either series or parallel based on desired outcome). In some cases, e.g., as depicted in FIG. 2D, two or more single-emitter laser diodes are combined together optically and connected electrically in series, within a laser module, with the primary purpose to produce more optical power ex-fiber for a given application. Additionally, or alternatively, a similar configuration can cause emission wavelengths to mix, such that the laser diodes operate simultaneously when the laser module is electrically activated.

FIG. 2E shows a coupling device 236, which can be used in the configuration 222 of FIG. 2D. Coupling device 236 can include a multi-laser beam integrated system 238, a lens 233, and an optical fiber 234. The multi-laser beam integrated system 238 can receive multiple laser beams, each with their own wavelength and associated lenses. The lens 233 can have a focal length such that the multiple laser beams in the multi-laser beam integrated system 238 are focused at an appropriate distance to an appropriate size, e.g., having a diameter less than the core diameter of the optical fiber, which can be about 100 μm. Within the optical fiber 234, there can be a light condensing lens 240 with magnifications around unity. The optical fiber 234 can be arranged to output the laser beam toward a motorized stage 242. Depending on the distance between the end of the optical fiber 234, the optical properties of the light condensing lenses 240, and the location of the motorized stage 242, the spot size of the emitted laser beam can be in the range of 10 to 100 μm.

FIG. 2F shows examples of multiple emitter laser sources for the universal laser system that employ optical beam combining into an optical fiber. A semiconductor laser diode bar is a semiconductor laser having multiple emitters in a single bar. Semiconductor lasers 264 can be made from a p-type material and n-type material, e.g., a p-side 266 (anode) and n-side 268 (cathode), forming a p-n junction. Semiconductor laser diode bars can be stacked vertically, e.g., along the z-axis. Configuration 262 can include multiple semiconductor diode laser bars 244, mounted onto compact micro-channel coolers or submounts for cooling, arranged in a vertical stack 246. Each semiconductor diode laser bar 244 can emit a horizontal beam, e.g., a beam having a width along the x-axis greater than its width along the z-axis, that travels in the same direction, e.g., along the y-axis. As a result, a stack of horizontal beams can travel towards a director lens 248. The director lens 248 can have the effect of narrowing the width of each beam along the x-axis, e.g., compressing a horizontal beam to a beam having a circular beam profile. Thus after encountering the director lens 248, a stack of beams with a circular profile travel towards a cylindrical lens 250. The cylindrical lens 250 can be convex and cause the stack of beams with a circular profile to focus at a focal distance away from the cylindrical lens 250, e.g., the stack of beams arranged along the z-axis become a single beam centered on a point on the z-axis. A small core optical fiber 252 can be placed in the optical path such that the single beam enters the small core optical fiber 252 with a sufficiently small beam profile, e.g., the width of the beam is less than the diameter of the small core optical fiber 252.

In another example, e.g., as depicted in FIGS. 2D and 2E, multiple discrete single emitter diode lasers that are mounted in, for example, a transistor outline (TO)-can package and are coupled to an optical fiber, where the distal end exhibits focusing optics for the application. As depicted, a laser module may generate optical powers approaching hundreds of Watts in a rather compact and reliable way. To achieve even greater optical power levels (multi-KW) in a compact form, a laser module can include multi-emitter bar in place of single emitter chips, e.g., as depicted in FIG. 2F.

In some implementations, a laser module can be configured to employ both wavelength selectivity and increased optical power by increasing the duplication of wavelengths in the same package as shown in FIG. 2G. For example, wavelengths from both the primary and secondary absorption bands can be integrated into a single module and can be operated separately or simultaneously as desired for a given application. Doing so may provide the application-dependent absorption enhancement, e.g., matching an application-based energy need to a particular application (potentially less energy would be required for marking and coding vs. perforation/separation).

Configuration 254 can include multiple laser sources divided into two groups with different heights in the diode laser, e.g., a high group and a low group. Each group can have three emission wavelengths, the high group 258 having wavelengths $\lambda_1$, $\lambda_2$, and $\lambda_3$, in the low group 260 having wavelengths $\lambda_4$, $\lambda_5$, and $\lambda_6$. Some of the wavelengths may be near another wavelength in the other group, e.g., $\lambda_1$~$\lambda_4$, $\lambda_2$~$\lambda_5$, and $\lambda_3$~$\lambda_6$. The various wavelength ranges for the dichroic mirrors of corresponding laser diodes in each group, e.g., high group 258 can have three unique transmission and reflection profiles, and low group 260 can have the same three transmission and reflection profiles. The dichroic mirrors can be arranged with descending cut off wavelengths for reflectivity to allow laser beams coming from the rear side to transmit through the dichroic mirrors towards a lens 256. In some implementations, the lens 256 is convex or plano-convex. The heights of the high group 258 and low group 260 of laser sources can result in the two beams, e.g., the high beam and the low beam, hitting the lens 256 at the same distance above or below the central axis of the lens 256. Consequently, the two beams will be focused at the same distance on the other side of the lens 256.

Referring back to FIG. 1, computer 110 of the universal laser system 100 can be in data communication with the one or more laser sources, e.g., via network 140. Program(s) 116 operating on computer 110 can be configured to adjust operating parameters of the one or more laser sources in response to a particular application, polymeric material, and desired outcome.

In some implementations, program(s) 116 can be configured to adjust one or more control parameters (for both the application in general and the "on-the-fly" approach) based on 1) irradiance, 2) interaction time, and/or 3) absorption into the material. These control parameters can be fixed, or adjusted in their application. The irradiance can be controlled by active adjustment of the focused spot size of the one or more lasers incident onto a surface of the desired interaction site of the polymeric material. Additionally or alternatively, irradiance can be varied by changing the optical power delivered by the one or more laser sources. In some embodiments, irradiance can be varied by a combination of the two.

A variable focus design can be implemented to provide dynamic changing of the focal length. A variable optical power option can be implemented by way of controlling, by the program(s) 116 operating on computer 110, the laser source activation energy. For example, the drive current can be used for the semiconductor laser. And, if more than one diode is employed and combined, then switching on more diodes and controlling each of their currents is an additional way optical energy can be varied.

The incident interaction time can be varied and/or controlled by the program(s) 116 operating on computer 110 by way of dwelling at a site for a fixed amount of time, or by operating a laser in a pulsed operating mode. Absorption control can be implemented by way of changing the emission wavelength of the one or more laser sources. Wavelength control can be implemented by, as described above, wavelength tuning of the laser and/or by turning on or off fixed or tuned wavelengths that have been optically combined. Enhancement of optical absorption can be generated by combining two or more wavelengths from the different absorption regions, i.e., secondary and primary absorption band wavelengths operating simultaneously. Doing so may enhance the absorption even in instances when optical power from one absorption region may not be as high as the other, i.e., <10W from the primary absorption band together with >10W from the secondary absorption band.

In some implementations, the program(s) 116 can be configured to change control parameters during a polymeric material process, e.g., a change in the absorption control parameter during a print-based process including multiple sub-processes, to enable multi-operational use from a single laser system. For example, for a web-print application, a first sub-process can include marking a specific code in one location and a second sub-process can include perforating the same substrate in another location. This may potentially require a change in absorption level from absorption at a surface of the polymeric material, to absorption through the entire substrate such as to enable creating a small hole.

In some implementations, the program(s) 116 can be configured to control parameters, between two different polymeric processes, e.g., change in the absorption control parameter between one polymeric material and/or substrate type and another polymeric material and/or substrate type. For example, if using the same laser printing line for two different materials, the system can switch from one material to a second material in a same production line.

The universal laser system 100 as described with reference to FIG. 1 can be utilized to perform one or more processes on polymeric materials. Tuning one or more of the control parameters of the system 100 can adjust a type of process performed on a polymeric material by the system 100. For example, adjusting an absorption of the laser output into the polymeric material, e.g., by wavelength selection, output power, or spot size, can determine, for a particular material including a set of material properties, a type of photothermal (pyrolytic) or photolytic (photochemical) process that occurs.

In general, exposure time (dwell time for a continuous wave laser, pulse width for a pulsed laser) of the incident optical irradiation onto a substrate will dictate the type of interaction that occurs, e.g., pyrolytic or photolytic. For example, an approximate time scale for each process is on the order of greater than tens of nanoseconds and less than nanoseconds for pyrolytic and photolytic processes, respectively. The absorption process can depend on both the photon energy and the peak optical irradiance. In other words, for the photon to be absorbed, it must have enough energy to bridge the gap between conduction and valence bands of the corresponding interaction mechanism, e.g., electronic or vibronic excitations. Additionally, to achieve non-linearity, the peak irradiance should surpass the non-linear threshold of the incident material. Together, the exposure time and the type of absorption coefficient can determine the marking process. Additionally, the depth of penetration can be dictated by an absorption of the polymeric material. The absorption coefficient and substrate thickness can together determine the feasibility of a desired marking process pursued.

Photothermally activated marking processes are governed primarily by linear optical absorption and a long interaction time of the incident optical power. The photon is absorbed on the surface, and its energy converts to heat. The heat generated is used to either modify or breakdown the surface and subsequent layers within the optical penetration depth. In some cases, the generated heat modifies or breaks down the heat affected zone. Once the heat generated in the targeted material is high enough, i.e., $T_m<T<T_d$, (where $T_m$ is melting temperature and $T_d$ is decomposition temperature) the heat will either modify the impacted surface by melting the material, causing the material to swell, or it will induce carbonization. Doing so would create a mark that may provide enough contrast to be seen by the human eye. If the temperature is raised further beyond the decomposition temperature, i.e., $T>T_d$, the targeted material will go beyond melting and begin to go through depolymerization followed by volatile decomposition, thus vaporizing it. This is primarily a thermal process and hence the impacted surface is modified by removal of the material, e.g., etching, engraving, ablation, or by modification, e.g., foaming, carbonization, annealing.

Photochemically activated marking processes are governed by non-linear absorption and shorter interaction times of the incident optical power. The short pulse generates a tremendous peak in the incident optical power, inducing multi-photon nonlinear interaction within the targeted material. The multiphoton generations increase the energy of the photon by a factor >2X, thus providing enough energy to dissociate the bonds with dipole molecules. This is primarily a chemical process, and hence the impacted surface is modified which, depending on which bond is dissociated, manifests as a color change, bleaching or oxidation. This can provide enough contrast to create a mark within the material with minimal or no physical change in the surface.

In some implementations, the system 100 may be used to perform marking and coding processes on polymeric materials. Selection of a wavelength within a range of available wavelengths for laser operation of the system 100 can tune a depth of penetration of the absorption processes to perform marking and coding at various depths within a polymeric material layer.

In some implementations, the system 100 may be used to perform perforation and separation processes, where a system including one or more laser systems and is configured to output multiple available operating wavelengths and/or a range of tunable operating wavelengths, which can be utilized to switch between a marking process and a perforation process in a same production line. Completely penetrating through the material thickness using a laser beam can create perforations in a material. In this case, absorption need only be at least enough to create an optical penetration depth on the order of the thickness of the material.

In some implementations, the system 100 may be used to perform laser welding, joining, and machining processes on polymeric materials. The system 100 can include a laser system configured to output a range of wavelengths that can be compatible with a range of polymeric materials utilized as an additive absorbing material or a transparent material combination to facilitate a welding or joining interface. By targeting the optical absorption peak, a minimum thickness for a welded layer can be small, depending on an absorption coefficient of the polymeric material used. The direct weld process can be the more seamless and desired process of the two.

In some implementations, the system 100 can perform additive manufacturing (AM) processes, i.e., three-dimensional (3D) printing processes and selected laser sintering (SLS), where the laser system can be configured to output a range of wavelengths compatible with polymeric materials utilized in the additive manufacturing of products. A choice of polymeric material can be dependent in part on it having an appropriate amount of absorptivity for the given lasing wavelength. As a result of absorption being strictly a thermal process, higher absorption leads to faster heating.

In some implementations, the universal laser system 100 may be used to perform selective processing on multilayer composite material, e.g., multiple layers of different polymeric materials, where each layer of the multilayer may have a different absorption coefficient. The laser source of the universal laser system 100 can be tuned to a particular wavelength to couple to an absorption peak of one of the multiple layers of the multilayer composite.

FIG. 3 is an example process 300 for controlling the universal laser system. The universal laser system receives, from a user, a set of user input parameters for a polymeric materials process for a product (302). User input parameters can define, for example, a type of process, e.g., perforation, etching, marking, coding, or an AM or SLS process, a material system including one or more polymeric materials for the product, a pattern or structure for the process, e.g., a marking pattern or AM product design. In some implementations, the system can automatically determine at least a portion of the user input parameters based on an output of another system.

The system can access, from a materials database, materials characteristics for a materials system of the product and laser specifications, from a laser specifications database, of a laser source (304). In some implementations, accessing the materials and laser specifications database is based on the user input. For example, the user input can include text or numerical ranges that provide search strings for accessing the materials and laser specifications databases. In some implementations, the laser specification can be preloaded into the system, so that the system can skip accessing the laser specifications. In some implementations, the materials characteristics for a materials system of the product can be preselected by a user, and the system can skip accessing materials characteristics for a materials system of the product.

The system determines, from the set of user input parameters, and based on materials characteristics for a materials system of the product and laser specifications of laser source(s) of the universal laser system, a set of control parameters (306). Control parameters can include irradiance, the interaction time, and the absorption into the material to perform the polymeric materials process on the product.

The system generates, from the control parameters, a set of operating instructions for controlling operation of a universal laser apparatus (308). Operating instructions include control signals for one or more laser sources of the universal laser apparatus, e.g., power output between 1 and 100 W, operating wavelength, dwell time (for CW laser sources, e.g., between 10 microseconds and 1 millisecond), beam overlap % (e.g., between 0-90% overlap), and the like.

The system provides, to the universal laser apparatus, the set of operating instructions to perform the polymeric materials process (310). In some implementations, the universal laser system uses the instructions to perform the polymeric materials process. In some implementations, the process 300 can include additional steps, fewer steps, or some of the steps can be divided into multiple steps.

Figure 4:
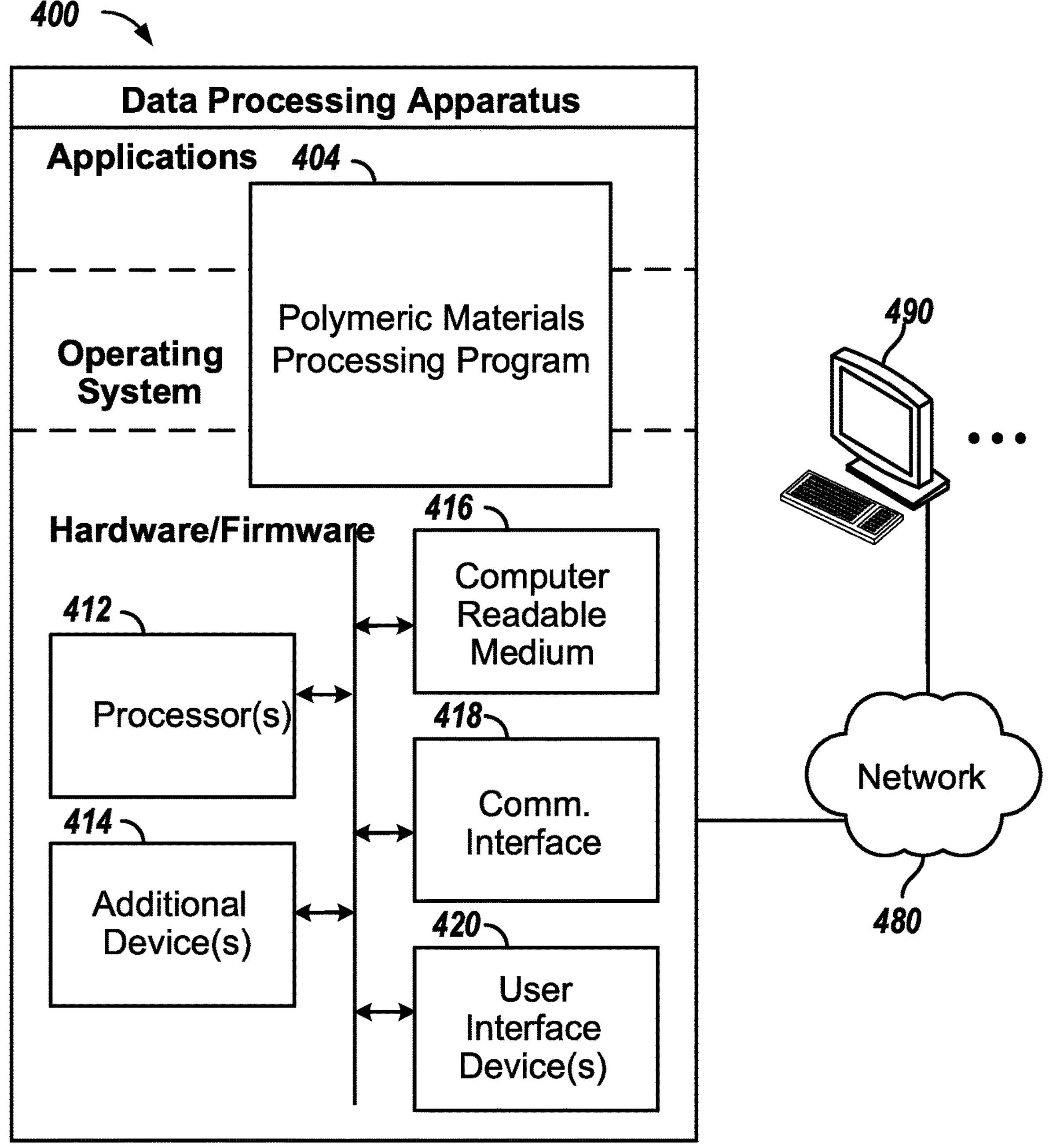
FIG. 4 is a schematic diagram of a data processing system usable to implement the described systems and techniques.

FIG. 4 is a schematic diagram of a data processing system including a data processing apparatus 400, which can be programmed as a client or as a server. The data processing apparatus 400 is connected with one or more computers 490 through a network 480. While only one computer is shown in FIG. 4 as the data processing apparatus 400, multiple computers can be used. The data processing apparatus 400 includes various software modules, which can be distributed among an applications layer, an operating system and firmware. These can include executable and/or interpretable software programs or libraries, including tools and services of a polymeric materials control program 404 that implements the systems and techniques described above, e.g., a product marking, perforation and/or separation control program 404, a product machining and/or cutting control program 404, a welding and/or joining control program 404, a 3D model and manufacturing control program 404, or a combination of one or more of these. The number of software modules used can vary from one implementation to another. Moreover, the software modules can be distributed on one or more data processing apparatus connected by one or more computer networks or other suitable communication networks.

The data processing apparatus 400 also includes hardware and/or firmware devices including one or more processors 412, one or more additional devices 414, a computer readable medium 416, a communication interface 418, and one or more user interface devices 420. Each processor 412 is capable of processing instructions for execution within the data processing apparatus 400. In some implementations, the processor 412 is a single or multi-threaded processor. Each processor 412 is capable of processing instructions stored on the computer readable medium 416 or on a storage device such as one of the additional devices 414. The data processing apparatus 400 uses the communication interface 418 to communicate with one or more computers 490, for example, over the network 480. Examples of user interface devices 420 include; a display; camera; speaker; microphone; tactile feedback device; keyboard; mouse; and VR and/or AR equipment. The data processing apparatus 400 can store instructions that implement operations associated with the program(s) described above, for example, on the computer readable medium 416 or one or more additional devices 414, for example, one or more of a hard disk device, an optical disk device, a tape device, and a solid-state memory device.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented using one or more modules of computer program instructions encoded on a non-transitory computer-readable medium for execution by, or to control the operation of, data processing apparatus. The computer-readable medium can be a manufactured product, such as hard drive in a computer system or an optical disc sold through retail channels, or an embedded system. The computer-readable medium can be acquired separately and later encoded with the one or more modules of computer program instructions, such as by delivery of the one or more modules of computer program instructions over a wired or wireless network. The computer-readable medium can be a machine-readable storage device, a machine-readable storage substrate, a memory device, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, a runtime environment, or a combination of one or more of them. In addition, the apparatus can employ various different computing model infrastructures, such as web services, distributed computing and grid computing infrastructures.

A computer program (also known as a program, software, software application, script, or code) can be written in any suitable form of programming language, including compiled or interpreted languages, declarative or procedural languages, and it can be deployed in any suitable form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., a field programmable gate array (FPGA) or an application-specific integrated circuit (ASIC).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions, and one or more memory devices for storing instructions and data. Generally, a computer will also include, or be operatively coupled to receive data from, or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including: semiconductor memory devices (e.g., Erasable Programmable Read-Only Memory (EPROM) and Electrically Erasable Programmable Read-Only Memory (EEPROM); flash memory devices; magnetic disks (e.g., internal hard disks or removable disks); magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a liquid crystal display (LCD), an organic light emitting diode (OLED), or another monitor for displaying information to the user, and a keyboard and a pointing device, e.g., a mouse or a trackball, by which the user can provide input to the computer. Other kinds of devices can be used to provide for interaction with a user as well; for example, feedback provided to the user can be any suitable form of sensory feedback, e.g., visual feedback, auditory feedback, or tactile feedback; and input from the user can be received in any suitable form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other. Embodiments of the subject matter described in this specification can be implemented in a computing system that includes a back-end component, e.g., a data server, or that includes a middleware component, e.g., an application server, or that includes a front-end component, e.g., a client computer having a graphical user interface or a web browser through which a user can interact with an implementation of the subject matter described is this specification, or any combination of one or more such back-end, middleware, or front-end components. The components of the system can be interconnected by any suitable form or medium of digital data communication, e.g., a communication network. Examples of communication networks include a local area network (LAN) and a wide area network (WAN), an inter-network (e.g., the Internet), and peer-to-peer networks (e.g., ad hoc peer-to-peer networks).

While this specification contains many implementation details, these should not be construed as limitations on the scope of what is being or may be claimed, but rather as descriptions of features specific to particular embodiments of the disclosed subject matter. Certain features that are described in this specification in the context of separate embodiments can also be implemented in combination in a single embodiment. Conversely, various features that are described in the context of a single embodiment can also be implemented in multiple embodiments separately, or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

EXAMPLES

Although the present application is defined in the attached claims, it should be understood that the present invention can also (additionally or alternatively) be defined in accordance with the following examples:

Thus, particular embodiments of the invention have been described. Other embodiments are within the scope of the following claims.

A System for Producing Infrared Laser Beeams Within a Particular Wavelength Range Example 1: A system comprising:

- a laser operable to produce an infrared laser beam for a range of wavelengths; an optics assembly operable to focus and direct the laser beam; and
- electronics communicatively coupled with the laser and the optics assembly, the electronics being configured to control the laser and the optics assembly, wherein the laser is configured to produce the infrared laser beam at wavelengths in the range of wavelengths that overlap with absorption peaks due to higher-order, non-linear oscillations of molecular bonds of each polymeric material of at least ten different polymeric materials, thereby generating heat from absorption of photon energy from the infrared laser beam.

Example 2: The system of any of the preceding Examples, wherein the laser is configured to produce the infrared laser beam in a wavelength range of 1.7 to 2.7 microns.

Example 3: The system of any of the preceding Examples, wherein the laser is operable to produce a continuously tunable infrared laser beam for the range of wavelengths, produce multiple discretely tunable infrared laser beams at multiple different wavelengths for the range of wavelengths, and/or a combination thereof.

Example 4: The system of any of the preceding Examples, wherein the laser is further configured to produce the infrared laser beam at another wavelength that overlaps with a primary absorption peak due to C—H dipole interactions of each polymeric material of the at least ten different polymeric materials.

Example 5: The system of Example 4, wherein the laser is configured to produce the infrared laser beam in a wavelength range of 3.2 to 3.6 microns.

Example 6: The system of Example 4, wherein the laser is configured to produce the infrared laser beam in a wavelength range of 6.5 to 7.5 microns.

Example 7: The system of any of the preceding Examples, wherein the laser is a first laser, further comprising a second laser, wherein the second laser is communicatively coupled with the electronics and configured to produce a second infrared laser beam for a second wavelength that overlaps a primary absorption peak due to C—H dipole interactions of each polymeric material of the at least ten different polymeric materials.

Example 8: The system of Example 7, wherein the first laser is configured to produce the infrared laser beam in a wavelength range of 1.7 to 2.7 microns, and the second laser is configured to produce the second infrared laser beam in a wavelength range of 3.2 to 3.6 or 6.5 to 7.5 microns.

Example 9: The system of Example 7 or Example 8, further comprising a third laser, wherein the third laser is communicatively coupled with the electronics and configured to produce a third infrared laser beam for third wavelength that overlaps a primary absorption peak due to C—H dipole interactions of each polymeric material of the at least ten different polymeric materials.

Example 10: The system of Example 9, wherein the first laser is configured to produce the infrared laser beam in a wavelength range of 1.7 to 2.7 microns, and the second laser is configured to produce the other infrared laser beam in a wavelength range of 3.2 to 3.6, and the third laser is configured to produce the third infrared laser beam in a wavelength range of 6.5 to 7.5 microns.

Example 11: The system of any of the preceding Examples, wherein the laser is a semiconductor laser based on II-VI or III-V compound materials such as InP, InGaAs or GaSb.

Example 12: The system of any of the preceding Examples, wherein the laser is a diode or fiber pumped solid-state laser.

Example 13: The system of any of the preceding Examples, wherein the laser is a solid-state laser comprising a host crystal of ZnS/Se doped with $Cr^{2+}$ or $Fe^{2+}$.

Example 14: The system of any of the preceding Examples, wherein the at least ten different polymeric materials comprise plastic, foam, and rubber materials.

Example 15: The system of Example 14, wherein the at least ten different polymeric materials comprise HDPE, LDPE, BOPP, PAI6, PAI6.6, PE, PET-G, PMMA, POM, PP, PVC, and PCV-p1.

Example 16: The system of any of the preceding Examples, wherein the heat generated by the absorption of photon energy from the infrared laser beam modifies or breakdowns, within an optical penetration depth, a surface and subsequent layers of a target polymeric material of the at least ten different polymeric materials.

Example 17: The system of Example 16, wherein the photon energy is greater than an energy required to dissociate molecular bonds of the target polymeric material.

Example 18: The system of any of the preceding Examples, further comprising a motorized mirror, wherein the laser is a diode laser.

Example 19: The system of any of the preceding Examples, wherein the optics assembly comprises focusing optics, wherein the laser comprises two or more single emitter diode lasers mounted in a transistor outline (TO)-can package and coupled to an optical fiber, wherein the focusing optics are adjacent to a distal end of one of the two or more single emitter diode lasers.

Example 20: The system of any of the preceding Examples, wherein the optics assembly comprises a multi-emitter bar.

Example 21: The system of any of the preceding Examples, wherein the laser is a semiconductor laser based on II-VI and/or III-V compounds and antimonides.

Controlling a Laser Apparatus

Example 22: A method for controlling a laser apparatus, comprising:

- receiving from a user, a set of user input parameters for a polymeric materials process for a product;
- accessing, from a materials database, materials characteristics for a materials system of the product and, from a laser specifications database, laser specifications of a laser source;
- determining, from the set of user input parameters, and based on the materials characteristics for a materials system of the product and the laser specifications of a laser source, a set of control parameters;
- generating, from the set of control parameters, a set of operating instructions for controlling operation of a universal laser apparatus; and
- providing, to the universal laser apparatus, the set of operating instructions to perform the polymeric materials process.

Example 23: The method of Example 22, wherein the control parameters comprise at least one of: irradiance, interaction time, and absorption time.

Example 24: The method Example 23, wherein adjusting a component of the universal laser apparatus varies the irradiance.

Example 25: The method of any of the preceding Examples 22-24, wherein the set of user input parameters comprise at least one of: a type of process, the materials system, and a pattern or a structure for the type of process.

Example 26: The method of any of the preceding Examples 22-25, wherein the set of operating instructions comprise at least one of the following: power output, operating wavelength, dwell time, and beam overlap.

Example 27: The method of any of the preceding Examples 22-26, wherein the materials database comprises data regarding at least one of: an additive, a colors, a dyes, a doping, an absorption coefficient, a chemical structure, a thickness of common products, a bond disassociation energy, a primary absorption band wavelength range, a secondary absorption band wavelength range, a thermal conductivity, a thermal diffusivity, a specific thermal capacitance, a glass transition temperature, a melting temperature, a crystallization temperature, a heat of fusion, a heat of vaporization, a vaporization temperatures, and a degradation temperatures of a plurality of polymeric materials.

Example 28: The method of any of the preceding Examples 22-27, wherein the laser specifications comprise at least one of: an operating wavelength, a tunability, a pulsewidth, an output power, a dwell time, a beam overlap, an operating voltage and current, a focal distance, an M-squared values, a pre-lensed beam diameter, and a mode of operation of the laser source.

Example 29: The method of any of the preceding Examples 22-28, wherein the universal laser apparatus comprises a plurality of laser sources, and the set of operating instructions comprise instructions to individually operate the plurality of laser sources.

Example 30: The method of any of the preceding Examples 22-29, wherein providing the set of operating instructions causes the universal laser apparatus to modify or breakdown, within an optical penetration depth, a surface and subsequent layers of a target polymeric material.

Similar operations and processes as describes in Examples 1 to 30 can be performed in a system comprising at least one process and a memory communicatively coupled to the at least one processor where the memory stores instructions that when executed cause the at least one processor to perform the operations. Further, a non-transitory computer-readable medium storing instructions which, when executed, cause at least one processor to perform the operations as describes in any one of the Examples 1 to 30 can also be implemented.

What is claimed is:

1. A system comprising:

a laser operable to produce an infrared laser beam for a range of wavelengths;

an optics assembly operable to focus and direct the infrared laser beam; and electronics communicatively coupled with the laser and the optics assembly, the electronics being configured to control the laser and the optics assembly, wherein the laser is configured to produce the infrared laser beam at wavelengths in the range of wavelengths that overlap with absorption peaks due to higher-order, non-linear oscillations of molecular bonds of each polymeric material of at least ten different polymeric materials, thereby generating heat from absorption of photon energy from the infrared laser beam.

2. The system of claim 1, wherein the laser is configured to produce the infrared laser beam in a wavelength range of 1.7 to 2.7 microns.

3. The system of claim 1, wherein the laser is further configured to produce the infrared laser beam at another wavelength that overlaps with a primary absorption peak due to C-H dipole interactions of each polymeric material of the at least ten different polymeric materials.

4. The system of claim 3, wherein the laser is configured to produce the infrared laser beam in a wavelength range of 3.2 to 3.6 microns.

5. The system of claim 3, wherein the laser is configured to produce the infrared laser beam in a wavelength range of 6.5 to 7.5 microns.

6. The system of claim 1, wherein the laser is a first laser, further comprising a second laser, wherein the second laser is communicatively coupled with the electronics and configured to produce a second infrared laser beam for a second wavelength that overlaps a primary absorption peak due to C-H dipole interactions of each polymeric material of the at least ten different polymeric materials.

7. The system of claim 1, wherein the laser is a semiconductor laser based on II-VI and/or III-V compounds and antimonides.

8. The system of claim 1, wherein the laser is operable to produce a continuously tunable infrared laser beam for the range of wavelengths.

9. The system of claim 1, wherein the laser is operable to produce multiple discretely tunable infrared laser beams at multiple different wavelengths for the range of wavelengths.

10. The system of claim 1, wherein the absorption peaks due to the higher-order, non-linear oscillations of molecular bonds of a polymeric material comprise absorption peaks in a secondary spectral absorption band of the polymeric material.

11. The system of claim 1, wherein the optics assembly comprises a diffraction grating, wherein a wavelength of the infrared laser beam is tunable by adjusting an orientation of the diffraction grating relative to the laser.

12. The system of claim 1, wherein the laser is a diode laser comprising:

a first side coated by a first coating having a first level of antireflection; and a second side opposite the first side, the second side coated by a second coating having a second level of antireflection that is different from the first level of antireflection, wherein producing the infrared laser beam comprises passing infrared energy through the first side and the second side.

13. A system comprising:

a laser operable to produce an infrared laser beam for a range of wavelengths, wherein the laser is operable to produce a continuously tunable infrared laser beam for the range of wavelengths, produce multiple discretely tunable infrared laser beams at multiple different wavelengths for the range of wavelengths, or a combination thereof;

an optics assembly operable to focus and direct the infrared laser beam; and electronics communicatively coupled with the laser and the optics assembly, the electronics being configured to control the laser and the optics assembly, wherein the laser is configured to produce the infrared laser beam at wavelengths in the range of wavelengths that overlap with absorption peaks due to higher-order, non-linear oscillations of molecular bonds of each polymeric material of at least ten different polymeric materials, thereby generating heat from absorption of photon energy from the infrared laser beam.

14. The system of claim 3, wherein the heat generated by the absorption of photon energy from the infrared laser beam modifies or breakdowns, within an optical penetration depth, a surface and subsequent layers of a target polymeric material of the at least ten different polymeric materials.

15. The system of claim 14, wherein the photon energy is greater than an energy required to dissociate molecular bonds of the target polymeric material.

16. The system of claim 13, further comprising a motorized mirror, wherein the laser is a diode laser, wherein a wavelength of the infrared laser beam is tunable by rotating the motorized mirror.

17. The system of claim 3, wherein the optics assembly comprises focusing optics, wherein the laser comprises two or more single emitter diode lasers mounted in a transistor outline (TO)-can package and coupled to an optical fiber, wherein the focusing optics are adjacent to a distal end of one of the two or more single emitter diode lasers.

18. The system of claim 3, wherein the optics assembly comprises a multi-emitter bar.

19. The system of claim 3, wherein the laser comprises at least two lasers configured to emit light at respective different wavelengths, and the system further comprises at least one dichroic mirror that is reflective of light in at least a first of the different wavelengths, is antireflective of light in at least a second of the different wavelengths, and is positioned to combine light from the at least two lasers.

20. The system of claim 19, wherein the at least two lasers consists of five lasers.

21. The system of claim 3, wherein the laser is operable to produce a continuously tunable infrared laser beam for the range of wavelengths.

22. The system of claim 13, wherein the laser is operable to produce multiple discretely tunable infrared laser beams at multiple different wavelengths for the range of wavelengths.

23. The system of claim 13, wherein the absorption peaks due to the higher-order, non-linear oscillations of molecular bonds of a polymeric material comprise absorption peaks in a secondary spectral absorption band of the polymeric material.

24. The system of claim 13, wherein the laser is a diode laser comprising:

a first side coated by a first coating having a first level of antireflection; and a second side opposite the first side, the second side coated by a second coating having a second level of antireflection that is different from the first level of antireflection wherein producing the infrared laser beam comprises passing infrared energy through the first side and the second side.

25. A system comprising:

a first laser operable to produce a first infrared laser beam for a range of wavelengths;

an optics assembly operable to focus and direct the first infrared laser beam;

electronics communicatively coupled with the first laser and the optics assembly, the electronics being configured to control the first laser and the optics assembly, wherein the first laser is configured to produce the first infrared laser beam at wavelengths in the range of wavelengths that overlap with absorption peaks due to higher-order. non-linear oscillations of molecular bonds of each polymeric material of at least ten different polymeric materials, thereby generating heat from absorption of photon energy from the first infrared laser beam; and a second laser, wherein the second laser is communicatively coupled with the electronics and configured to produce a second infrared laser beam for a second wavelength that overlaps a primary absorption peak due to C-H dipole interactions of each polymeric material of the at least ten different polymeric materials, wherein the first laser is configured to produce the first infrared laser beam in a wavelength range of 1.7 to 2.7 microns, and the second laser is configured to produce the second infrared laser beam in a wavelength range of 3.2 to 3.6 or 6.5 to 7.5 microns.

26. The system of claim 25, further comprising a third laser, wherein the third laser is communicatively coupled with the electronics and configured to produce a third infrared laser beam for a third wavelength that overlaps a primary absorption peak due to C-H dipole interactions of each polymeric material of the at least ten different polymeric materials.

27. The system of claim 26, wherein the first laser is configured to produce the first infrared laser beam in a wavelength range of 1.7 to 2.7 microns, and the second laser is configured to produce the second infrared laser beam in a wavelength range of 3.2 to 3.6microns, and the third laser is configured to produce the third infrared laser beam in a wavelength range of 6.5 to 7.5 microns.

28. The system of claim 8, wherein the first laser is a semiconductor laser based on II-VI or III-V compound materials such as InP, InGaAs or GaSb.

29. The system of claim 8, wherein the first laser is a diode or fiber pumped solid-state laser.

30. The system of claim 8, wherein the first laser is a solid-state laser comprising a host crystal of ZnS/Se doped with $Cr^{2+}$ or $Fe^{2+}$.

31. The system of claim 8, wherein the at least ten different polymeric materials comprise plastic, foam, and rubber materials.

32. The system of claim 31, wherein the at least ten different polymeric materials comprise HDPE, LDPE, BOPP, PAI6, PAI6.6, PE, PET-G, PMMA, POM, PP, PVC, and PCV-pl.

33. The system of claim 25, wherein the first laser is operable to produce a continuously tunable infrared laser beam for the range of wavelengths.

34. The system of claim 25, wherein the first laser is operable to produce multiple discretely tunable infrared laser beams at multiple different wavelengths for the range of wavelengths.

35. The system of claim 25, wherein the absorption peaks due to the higher-order, non-linear oscillations of molecular bonds of a polymeric material comprise absorption peaks in a secondary spectral absorption band of the polymeric material.

36. The system of claim 25, wherein the optics assembly comprises a diffraction grating, wherein a wavelength of the first infrared laser beam is tunable by adjusting an orientation of the diffraction grating relative to the first laser.

* * * * *